(12) United States Patent
Chetlur et al.

(10) Patent No.: US 9,230,861 B2
(45) Date of Patent: Jan. 5, 2016

(54) METHOD OF FORMING A BACKSIDE CONTACT STRUCTURE HAVING SELECTIVE SIDE-WALL ISOLATION

(71) Applicant: TELEFUNKEN Semiconductors AMERICA LLC, Roseville, CA (US)

(72) Inventors: Sundar Chetlur, Roseville, CA (US); Guy Ng, Roseville, CA (US)

(73) Assignee: Telefunken Semiconductors America LLC, Roseville, CA (US)

( * ) Notice: Subject to any disclaimer, the term of this patent is extended or adjusted under 35 U.S.C. 154(b) by 0 days.

(21) Appl. No.: 14/050,335

(22) Filed: Oct. 9, 2013

(65) Prior Publication Data
US 2014/0099772 A1    Apr. 10, 2014

Related U.S. Application Data

(60) Provisional application No. 61/711,692, filed on Oct. 9, 2012.

(51) Int. Cl.
*H01L 21/76*    (2006.01)
*H01L 21/768*    (2006.01)
*H01L 21/762*    (2006.01)
*H01L 21/74*    (2006.01)

(52) U.S. Cl.
CPC ........ *H01L 21/76898* (2013.01); *H01L 21/743* (2013.01); *H01L 21/76224* (2013.01); *H01L 21/76879* (2013.01)

(58) Field of Classification Search
None
See application file for complete search history.

(56) References Cited

U.S. PATENT DOCUMENTS

| | | | | |
|---|---|---|---|---|
| 7,015,086 | B2 * | 3/2006 | Chang | H01L 21/763 257/E21.549 |
| 8,188,543 | B2 * | 5/2012 | Roggenbauer | H01L 21/76264 257/347 |
| 2006/0261444 | A1 * | 11/2006 | Grivna | H01L 21/743 257/576 |
| 2008/0023787 | A1 * | 1/2008 | Shimada | H01L 21/761 257/506 |

* cited by examiner

*Primary Examiner* — Benjamin Sandvik
*Assistant Examiner* — Herve Assouman
(74) *Attorney, Agent, or Firm* — Angus C. Fox, III

(57) ABSTRACT

A backside contact structure is created using the following sequence of steps: etching a deep trench from the front surface of the semiconductor wafer to the buried layer to be contacted; depositing an isolation layer into the trench which covers the surfaces of the trench; performing an ion beam anisotropic etch in order to selectively etch the isolation layer at the bottom of the trench; filling the trench with a conductive material in order to create an electrical connection to the backside layer. The process can either be performed at a front-end stage of wafer processing following the formation of shallow trench isolation structures, or at a back-end stage after device transistors are formed. The backside contact structure so fabricated is used to electrically isolate circuit structures constructed on the wafer's upper surface, so that the various components of an integrated circuit can operate at different reference voltages.

18 Claims, 27 Drawing Sheets

METHOD OF FORMING A BACKSIDE CONTACT STRUCTURE HAVING SELECTIVE SIDE-WALL ISOLATION

FIELD OF THE INVENTION

This invention relates, generally, to integrated circuit manufacture and, more particularly, to the formation of a backside contact structure in integrated circuits having deep trench isolation between adjacent devices.

SUMMARY OF THE INVENTION

A backside contact structure is created using a process with the following sequence of steps: etching a deep trench on the front surface of the semiconductor wafer to the buried layer to be contacted; depositing an isolation layer into the trench which covers the surfaces of the trench; performing an ion beam anisotropic etch in order to selectively etch the isolation layer at the bottom of the trench; filling the trench with a conductive material in order to create an electrical connection to the backside layer. The process can either be performed at a front-end stage of wafer processing following the formation of shallow trench isolation, or at a back-end stage after device transistors are formed. The backside contact structure so fabricated is used to electrically isolate circuit structures constructed on the wafer's upper surface, so that the various components of an integrated circuit can operate at different reference voltages.

BRIEF DESCRIPTION OF THE DRAWINGS

FIG. 1 is a thin slice view of a small portion of a semiconductor wafer substrate following a high-energy implant with an N-type dopant, such as arsenic;

FIG. 2 is a view of the wafer portion of FIG. 1 following a high-temperature anneal step, which repairs lattice damage to the implanted wafer substrate, activates the N-type implant, thereby creating an N-type layer on the surface of the wafer, which is followed by the subsequent growth of an epitaxial silicon layer on top of N-type layer, thereby transforming the N-type layer into an N-type buried layer on the wafer;

FIG. 3 is a view of the wafer portion of FIG. 2 following creation of a thermal oxide layer, deposition of a silicon nitride layer, the subsequent deposition of a non-doped silicate glass layer, and the formation of a photoresist mask, all on the upper surface of the wafer;

FIG. 4 is a view of the wafer portion of FIG. 3 following an anisotropic etch, which forms a hard etch mask and a subsequent photoresist strip step;

FIG. 5 is a view of the wafer portion of FIG. 4 following a dry etch with sidewall passivation and formation of shallow isolation trenches;

FIG. 6 is a view of the wafer portion of FIG. 5 following the formation of a silicon dioxide layer using chemical vapor deposition or high-density plasma deposition;

FIG. 7 is a view of the wafer portion of FIG. 6 following a chemical mechanical planarization step which leaves silicon dioxide isolation structures in the shallow isolation trenches;

FIG. 8 is a view of the wafer portion of FIG. 7 following the deposition of a silicon nitride hard mask layer and the subsequent formation of a photoresist mask;

FIG. 9 is a view of the wafer portion of FIG. 8 following a dry reactive ion nitride etch that creates a silicon nitride hard mask and etches through one of silicon dioxide isolation structures;

FIG. 10 is a view of the wafer portion of FIG. 9 following a photoresist strip step;

FIG. 11 is a view of the wafer portion of FIG. 10 following a deep trench isolation (DTI) etch, which etches through the substrate and into the N-doped base layer;

FIG. 12 is a view of the wafer portion of FIG. 11 following a thermal oxidation step, which coats the walls of the contact shaft formed in FIG. 10 with a dielectric layer;

FIG. 13 is a view of the wafer portion of FIG. 12 following an ion beam etch which removes the thermal oxide at the bottom of the contact shaft;

FIG. 14 is a view of the wafer portion of FIG. 13 following the deposition of a doped polysilicon layer, which fills the contact shaft and coats the upper surface of the wafer;

FIG. 15 is a view of the wafer portion of FIG. 14 following a chemical mechanical planarization step, which removes portions of the doped polysilicon layer which are outside the contact shaft;

FIG. 16 is a view of the wafer portion of FIG. 15 following the plasma deposition of a silicon nitride layer and of a borophosphosilicate glass (BPSG) layer;

FIG. 17 is a view of the wafer portion of FIG. 16 following a reduction in thickness of the BPSG layer and planarization of the wafer using chemical mechanical planarization (CMP);

FIG. 18 is a view of the wafer portion of FIG. 17 following the deposition of a TEOS silicon dioxide layer and patterning of the wafer with photoresist;

FIG. 19 is a view of the wafer portion of FIG. 18 following a reactive ion contact etch, which stops on the doped polysilicon plug in the contact shaft;

FIG. 20 is a view of the wafer portion of FIG. 19 following deposition of a tungsten metal layer;

FIG. 21 is a view of the wafer portion of FIG. 20 following a chemical mechanical planarization step, which leaves tungsten metal only within the contact openings;

FIG. 22 is a thin slice view of a small portion of a semiconductor wafer showing a structure that includes a silicon dioxide-filled shallow trench adjacent a field effect transistor having a silicided gate and silicided lightly-doped source/drain regions, with the entire wafer portion coated with a silicon nitride layer, then with a TEOS silicon dioxide layer that has been masked with a photoresist pattern;

FIG. 23 is a view of the wafer portion of FIG. 22 following a reactive ion etch through the TEOS oxide layer, the silicon nitride layer, and the silicon dioxide shallow trench fill, and a subsequent photoresist strip step;

FIG. 24 is a view of the wafer portion of FIG. 23 following a deep-trench reactive ion etch step to form a contact shaft;

FIG. 25 is a view of the wafer portion of FIG. 24 following formation of a thin thermal oxide layer and a subsequent deposition of a TEOS silicon dioxide layer, which coats the walls of the contact shaft;

FIG. 26 is a view of the wafer portion of FIG. 25 following an ion beam etch step, which removes the oxide layer at the bottom of the contact shaft;

FIG. 27 is a view of the wafer portion of FIG. 26 following deposition of a doped polysilicon layer within the contact shaft and on the upper surface of the wafer;

PREFERRED EMBODIMENT OF THE INVENTION

The invention will now be described with reference to the attached drawing figures. It should be understood that the figures are not drawn to scale, and are intended to be merely representative of the inventive process. The process can be performed either immediately following the formation of trench isolation structures in the epitaxial silicon or after both the formation of shallow trench isolation structures and the formation of field-effect transistor structures. FIGS. 1 through 21 show a process for creating a backside contact structure using a silicon nitride hard mask immediately following silicon shallow trench isolation processing.

Figure 1:
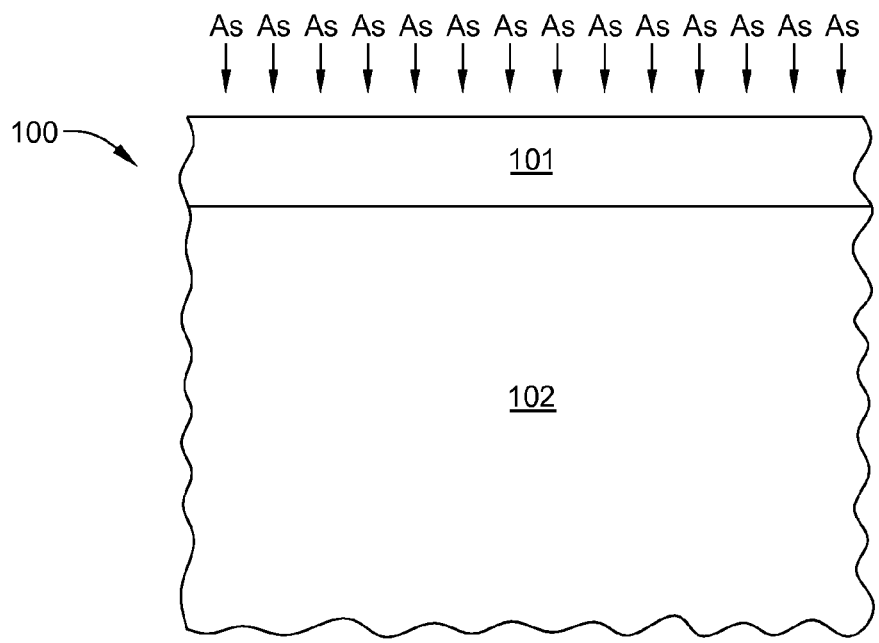
FIGS. 1 through 14 show a process for creating a backside contact structure using a silicon nitride hard mask immediately following shallow silicon trench isolation processing.

Referring now to FIG. 1, an epitaxial P-type silicon wafer 100 has been subjected to a high-energy implant with an N-type dopant, such as arsenic, followed by a high temperature anneal, which repairs lattice damage to the implanted wafer substrate, and activates the N-type implant, thereby creating an N-type layer 101 on the surface of a P-type silicon substrate 102.

Figure 2:
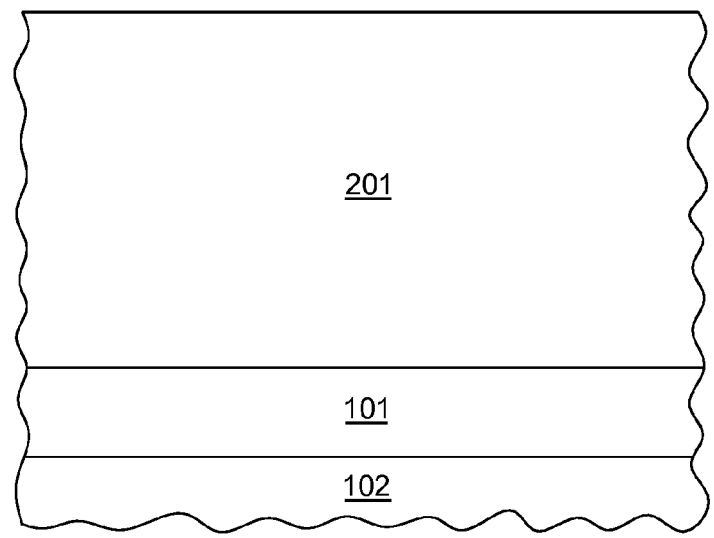

Referring now to FIG. 2, the in-process wafer of FIG. 1 has been further processed by growing a new epitaxial silicon layer 201 on top of the N-type layer 101, thereby transforming the N-type layer into an N-type buried layer 202 on the wafer, the upper boundary of which is some 7.5 μm below the upper surface of the wafer.

Figure 3:
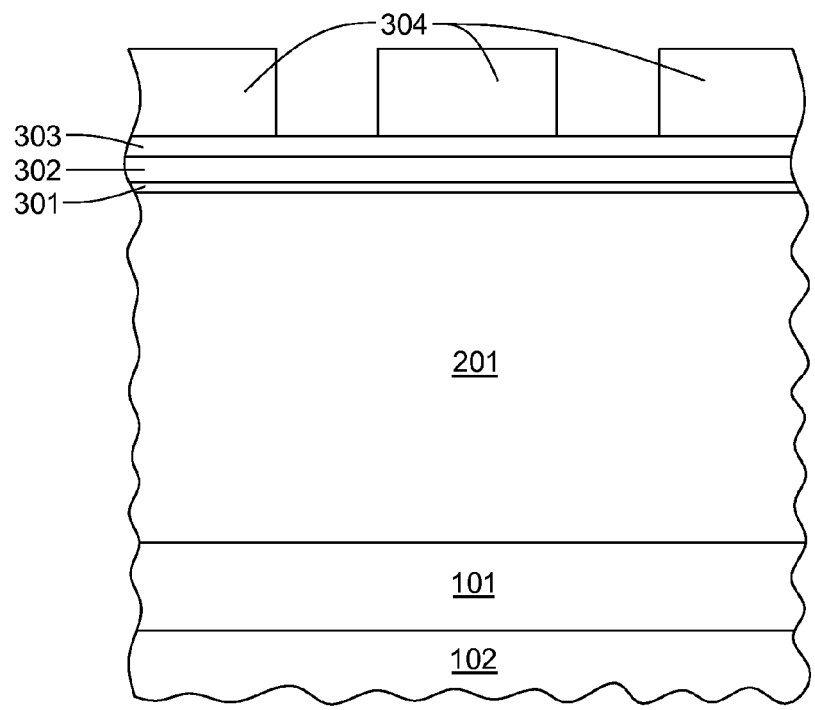

Referring now to FIG. 3, the wafer of FIG. 2 has been further processed by creating a thermal oxide layer 301 that is about 500 Å thick on the wafer's upper surface, depositing a silicon nitride layer 302 that is about 2400 Å thick on top of the thermal oxide layer 301, and depositing a non-doped silicate glass layer 303 that is about 2000 Å thick on top of the silicon nitride layer 302 using chemical vapor deposition and tetraethyl orthosilicate as a precursor compound. A photoresist mask pattern 304 is formed on top of the glass layer 303.

Figure 4:
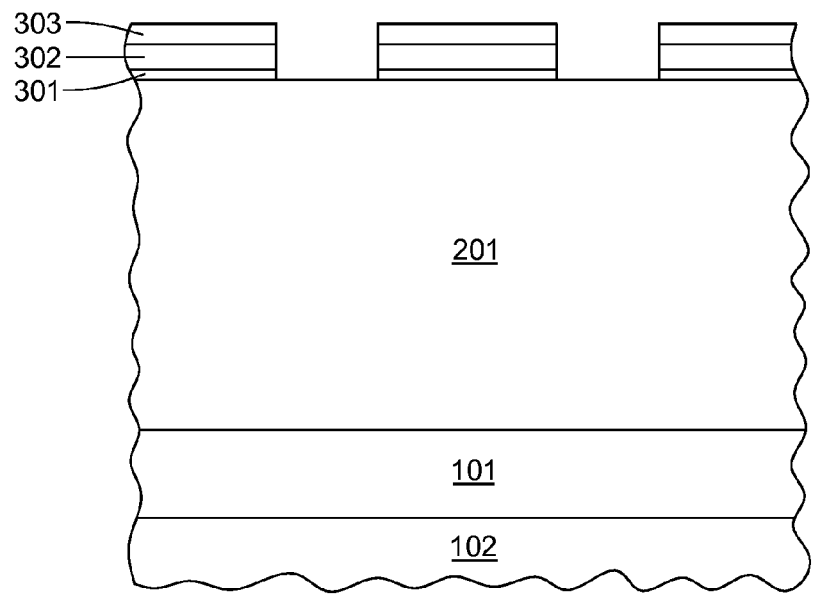

Referring now to FIG. 4, the in-process wafer of FIG. 3 has been further processed by etching the hard mask, which consists of the thermal oxide layer 301, the silicon nitride layer 302 and the non-doped silicate glass layer 303, using an anisotropic plasma etch. Following the plasma etch, the photoresist mask pattern 304 is stripped.

Figure 5:
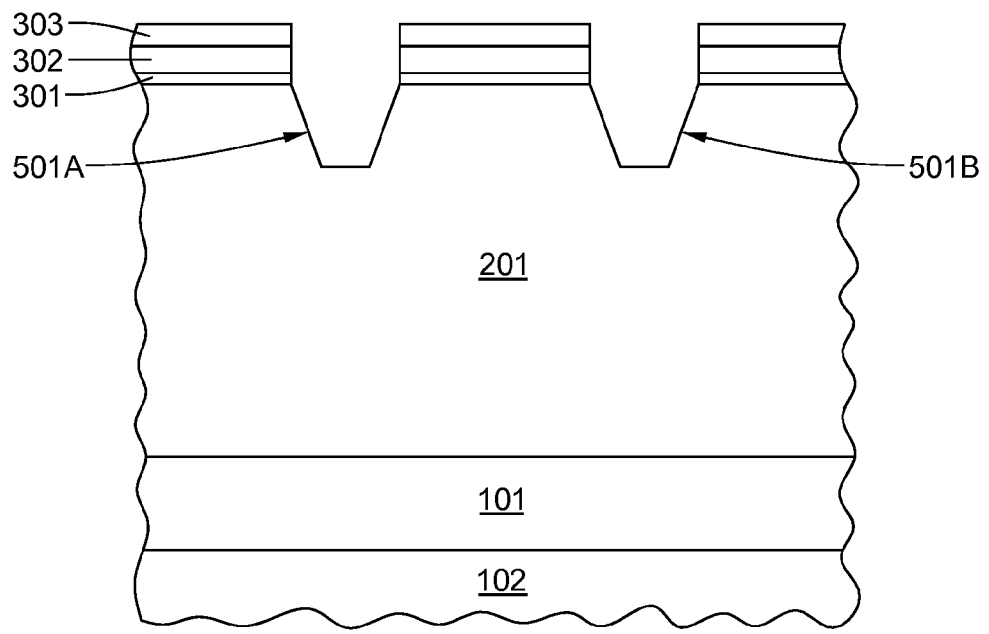

Referring now to FIG. 5, the in-process wafer of FIG. 4 has been further processed by subjecting it to a dry etch. Etch chemistry is selected so that sidewall passivation occurs during the etch, thereby resulting in trenches 501A and 501B having a tapered geometry.

Figure 6:
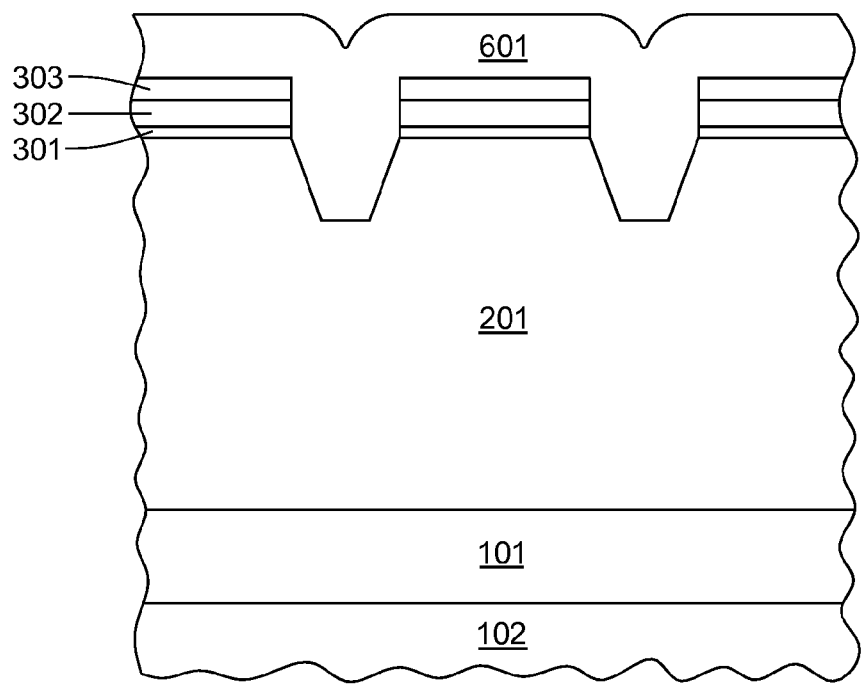

Referring now to FIG. 6, the in-process wafer of FIG. 5 has been further processed by depositing a silicon dioxide layer 601 via high-density plasma deposition or chemical vapor deposition. The silicon dioxide layer 601 completely fills the trenches 501A and 501B and covers the upper surface of the wafer.

Figure 7:
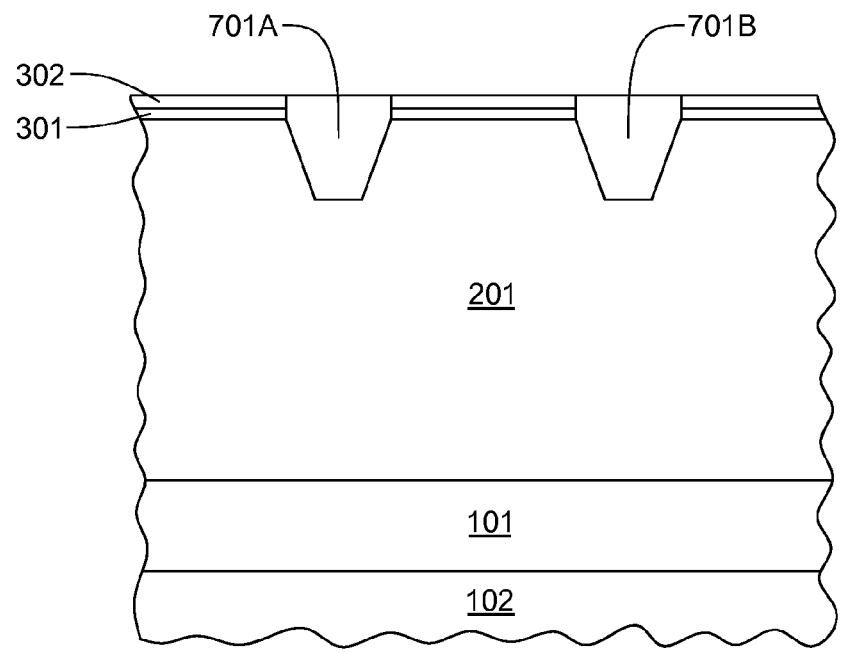

Referring now to FIG. 7, the in-process wafer of FIG. 6 has been further processed by subjecting it to a chemical mechanical planarization step, which removes silicon dioxide from layer 601 that is not within the trenches 501A and 501B, removes the non-doped silicate glass layer 303, and reduces the thickness of the silicon nitride layer 302 to about 1200 Å. The trenches 501A and 501B are filled with non-doped silicate glass isolation structures 701A and 701B, respectively.

Figure 8:
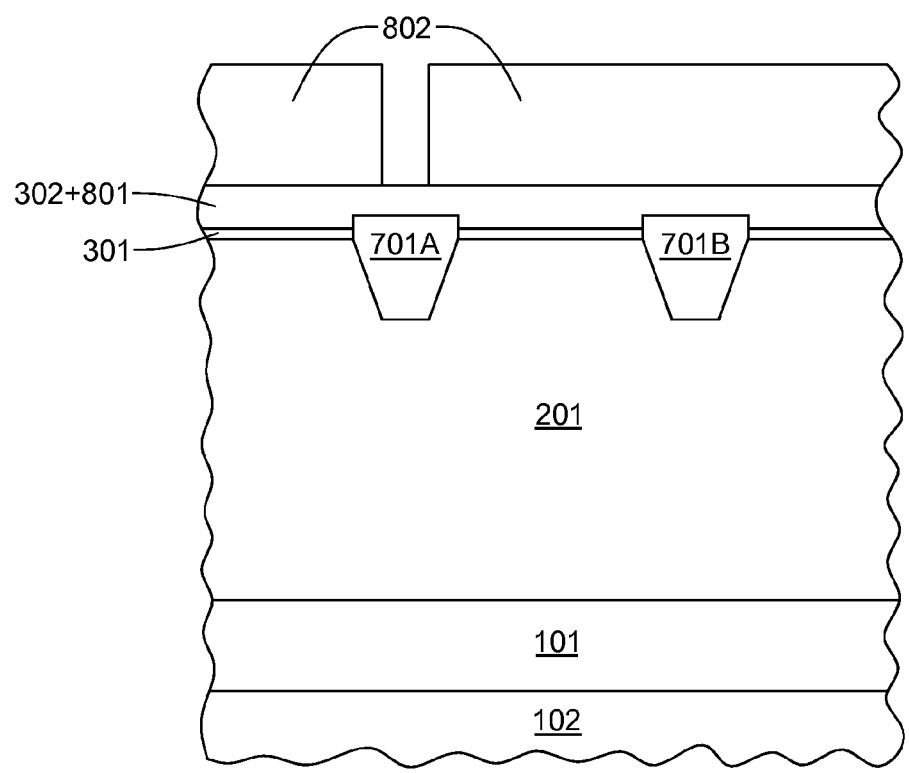

Referring now to FIG. 8, the in-process wafer of FIG. 7 has been further processed by depositing a silicon nitride hard mask layer 801 that is about 4000 Å thick using chemical vapor deposition and forming a photoresist mask pattern 802 on top of the silicon nitride hard mask layer 801.

Figure 9:
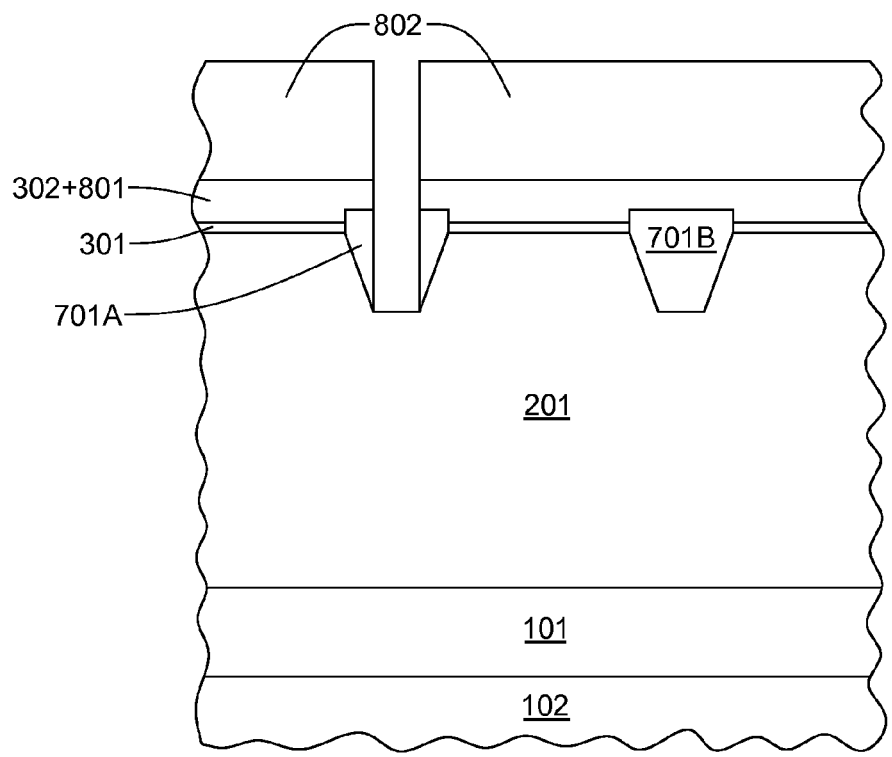

Referring now to FIG. 9, the in-process wafer of FIG. 8 has been further processed by subjecting it to a dry reactive ion nitride etch that creates a silicon nitride hard mask and etches through the silicon dioxide isolation structure 701A. It should be mentioned that contacts to the N-type buried layer 101 are made through the silicon dioxide isolation structures in order to maximize wafer real estate that is available for device structures.

Figure 10:
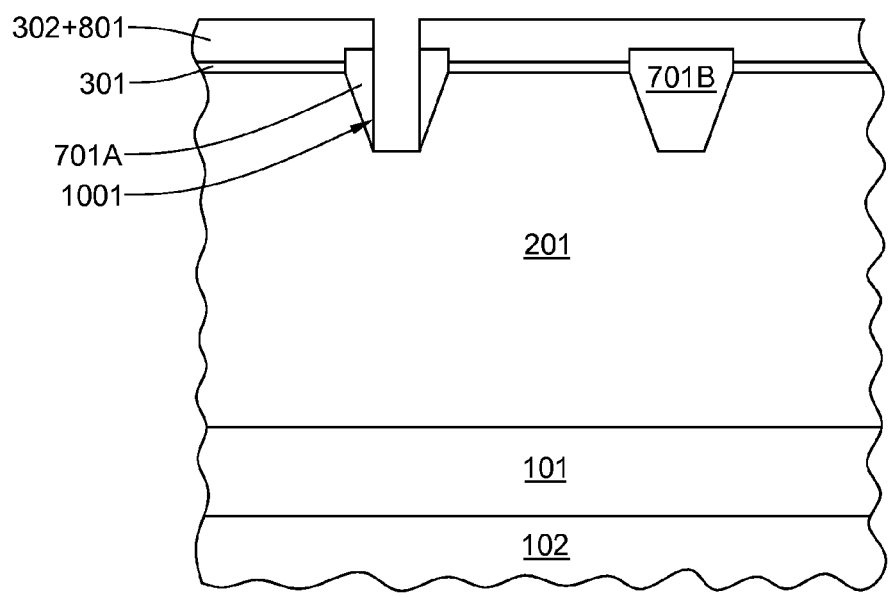

Referring now to FIG. 10, the in-process wafer of FIG. 9 has been further processed by stripping the photoresist mask 802. A generally vertical aperture 1001 through the silicon dioxide isolation structure 701A has been formed.

Figure 11:
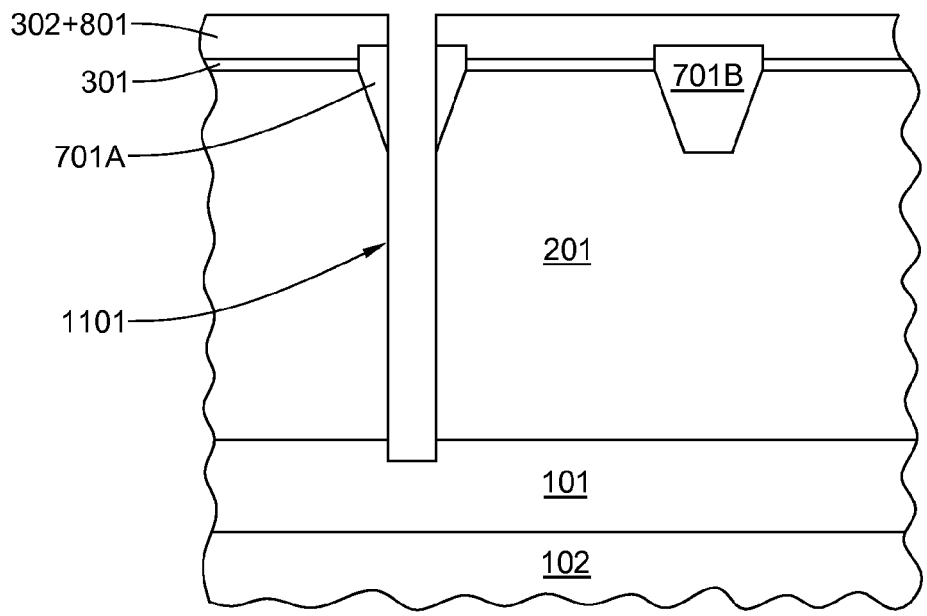

Referring now to FIG. 11, the in-process wafer of FIG. 10 has been further processed by subjecting it to a high-density plasma silicon deep trench isolation (DTI) etch, which etches down into the new epitaxial silicon layer 201, forming a contact shaft 1101 that ends in the N-doped buried layer 101.

Figure 12:
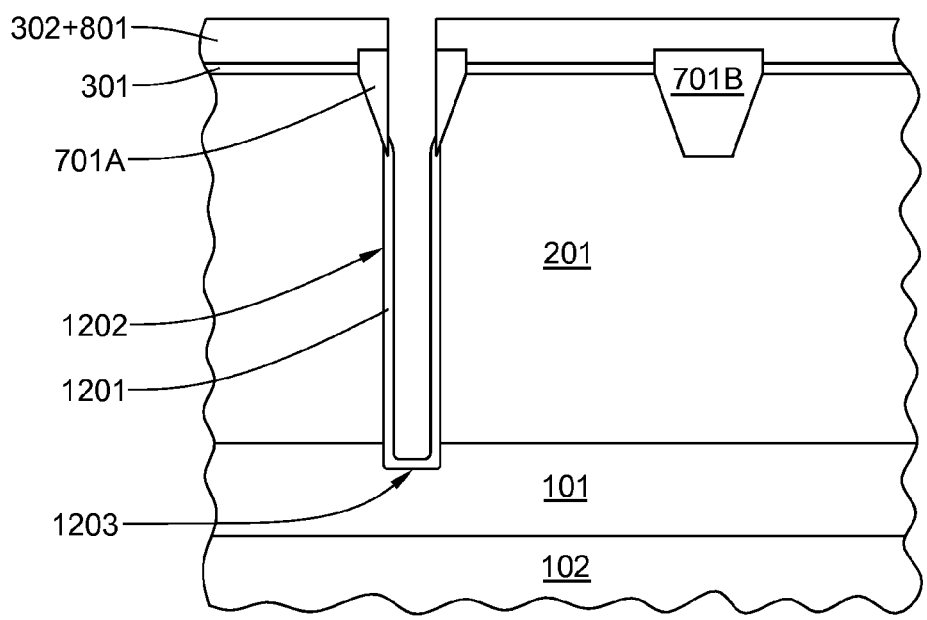

Referring now to FIG. 12, the in-process wafer of FIG. 11 has been further processed by subjecting it to a dry thermal oxidation step, which forms a thermal oxide layer 1201 on the walls 1202 and bottom 1203 of the contact shaft 1101 formed during the etch steps of FIG. 11.

Figure 13:
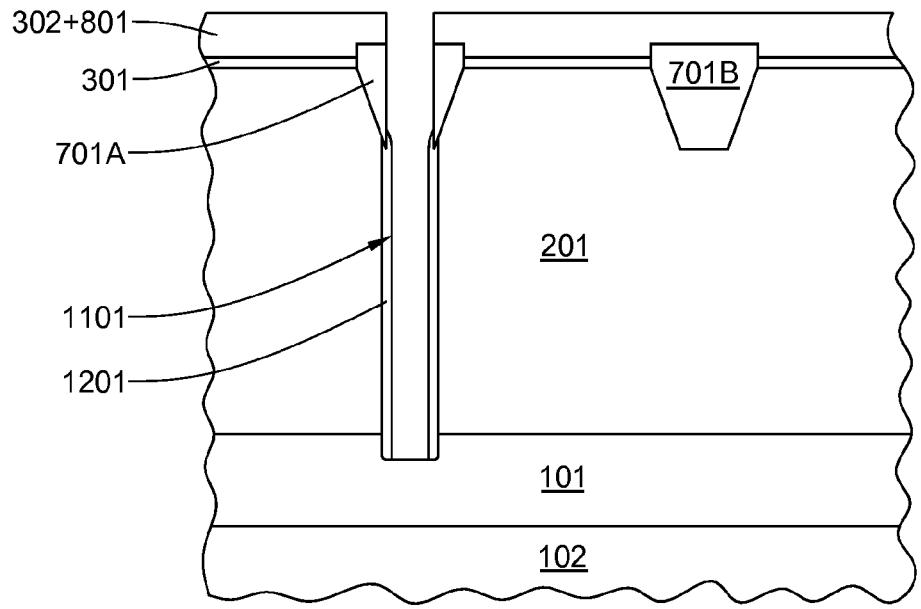

Referring now to FIG. 13, the in-process wafer of FIG. 12 has been further processed by subjecting it to an ion beam etch, which clears that portion of the thermal oxide layer 1201 at the bottom 1203 of the contact shaft 1101.

Figure 14:
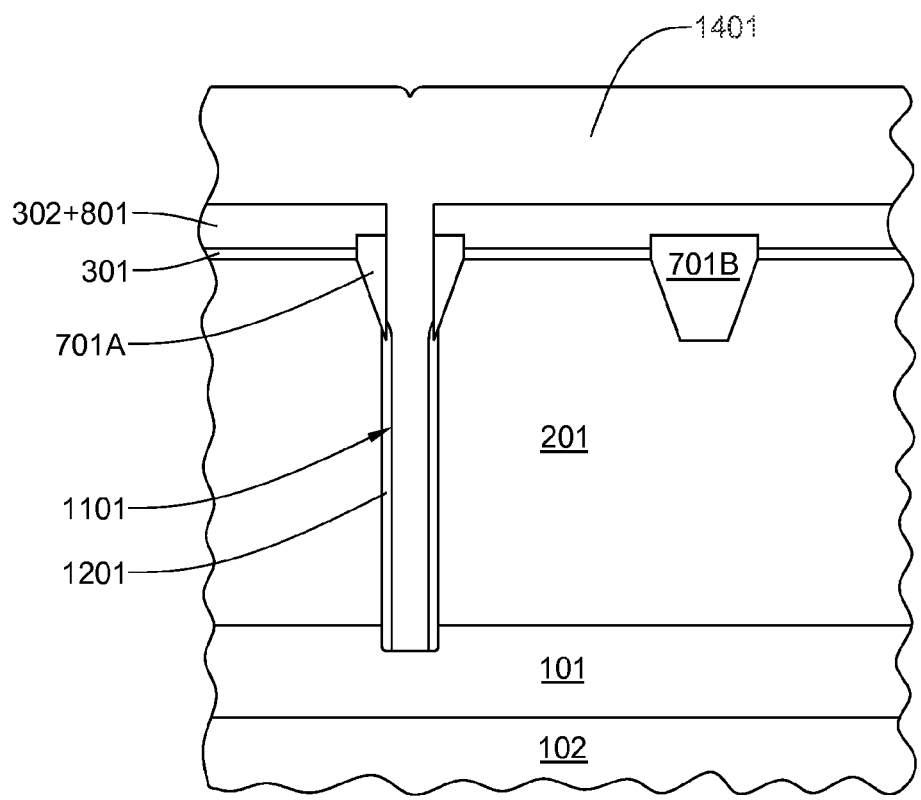

Referring now to FIG. 14, the in-process wafer of FIG. 13 has been further processed by depositing an N-doped polysilicon layer 1401, which fills the contact shaft 1101 and coats the upper surface of the wafer.

Figure 15:
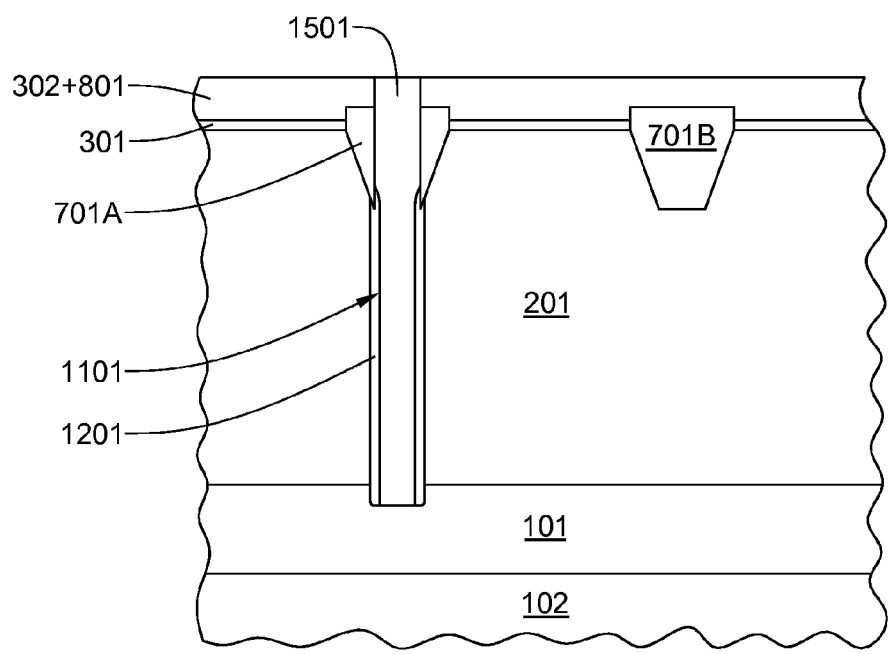
FIGS. 15 through 27 show a process for creating a backside contact structure following silicon trench isolation processing and transistor formation, using a TEOS oxide hard mask. The drawing figures are thin slices of a small portion of a semiconductor wafer undergoing processing during integrated circuit manufacture, given that no background structures are visible, as would be the case in a cross-sectional view. No sectional hatching is used, as such convention tends to make the drawing figures very busy and more difficult to interpret.

Referring now to FIG. 15, the in-process wafer of FIG. 14 has been further processed by subjecting it to a chemical mechanical planarization step, which removes portions of the doped polysilicon layer 1401 which are outside the contact shaft 1101, thereby leaving a doped polysilicon plug 1501 in the contact shaft 1101.

Figure 16:
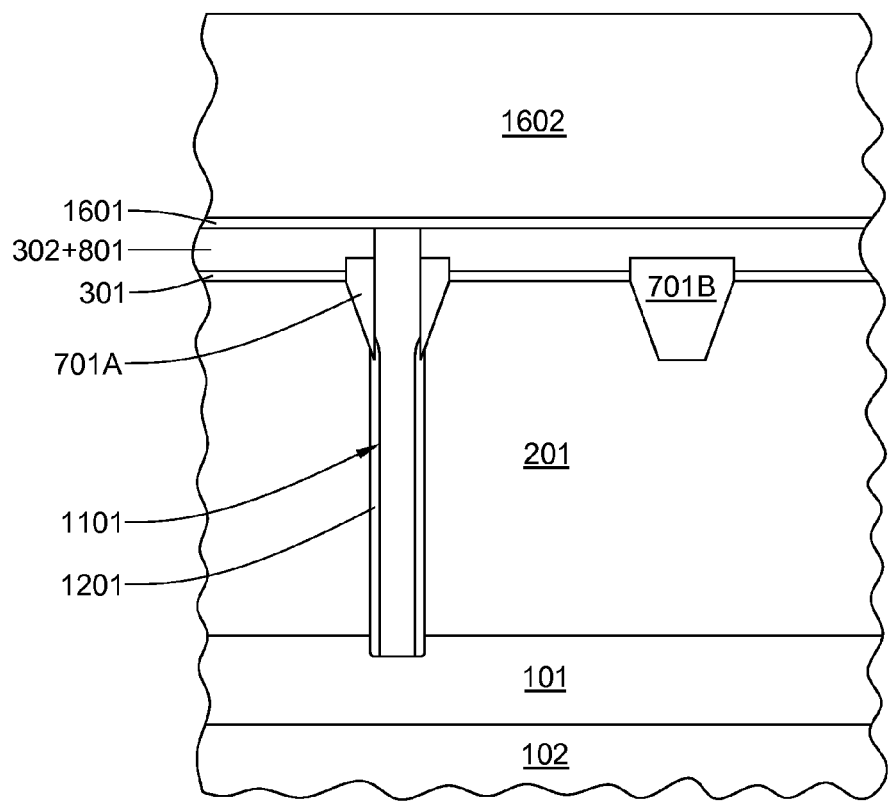

Referring now to FIG. 16, the in-process wafer of FIG. 15 has been further processed by depositing a silicon nitride layer 1601 and a borophosphosilicate glass (BPSG) layer 1602 using plasma deposition for each layer.

Figure 17:
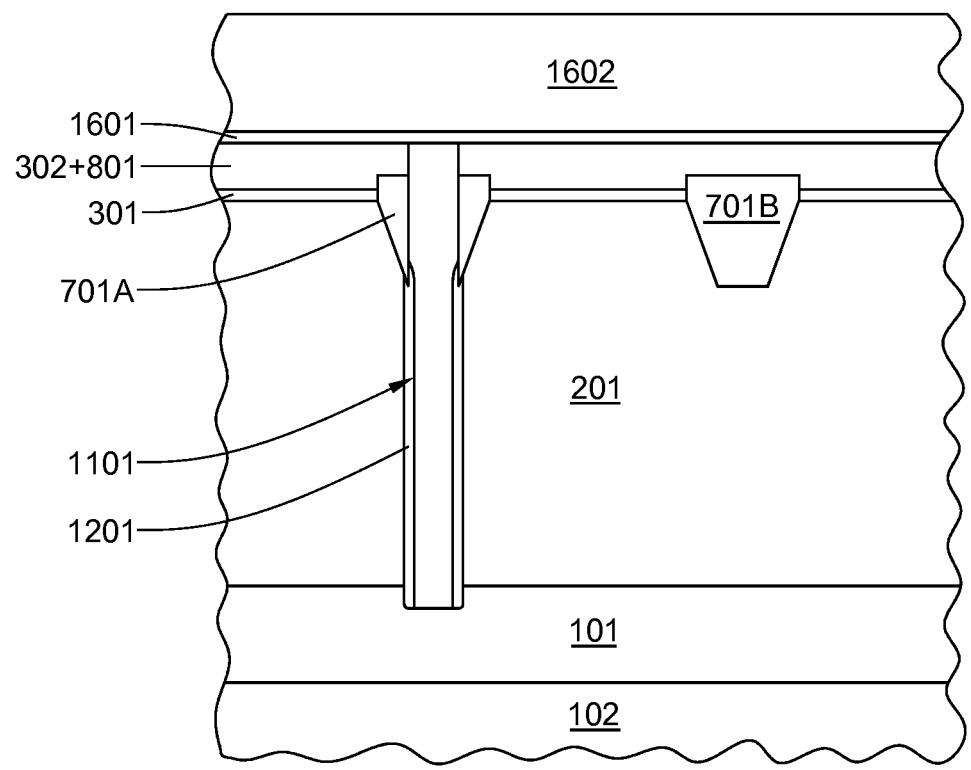

Referring now to FIG. 17, the in-process wafer of FIG. 16 has been further processed by subjecting the wafer to chemical mechanical planarization (CMP), thereby planarizing the wafer and reducing the thickness of the BPSG layer 1602.

Figure 18:
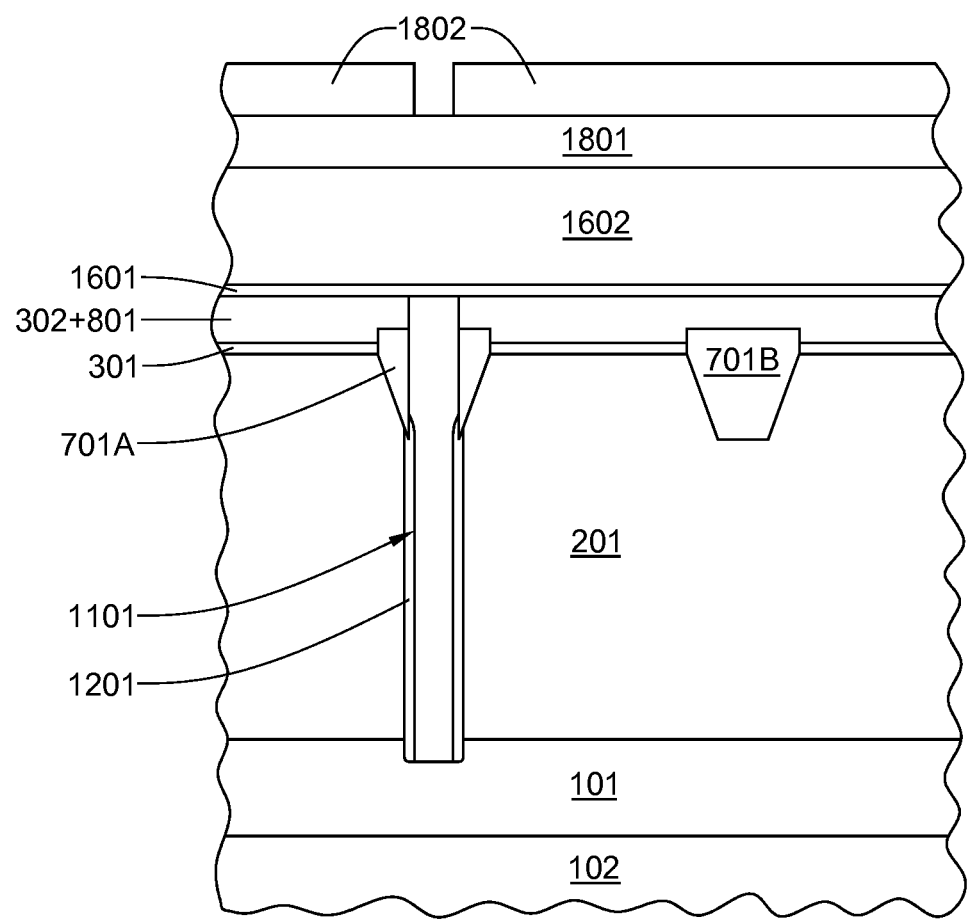

Referring now to FIG. 18, the in-process wafer of FIG. 17 has been further processed by depositing a silicon dioxide layer 1801 on top of the BPSG layer 1602, and subsequently masking the silicon dioxide layer 1801 with a photoresist contact mask pattern 1802.

Figure 19:
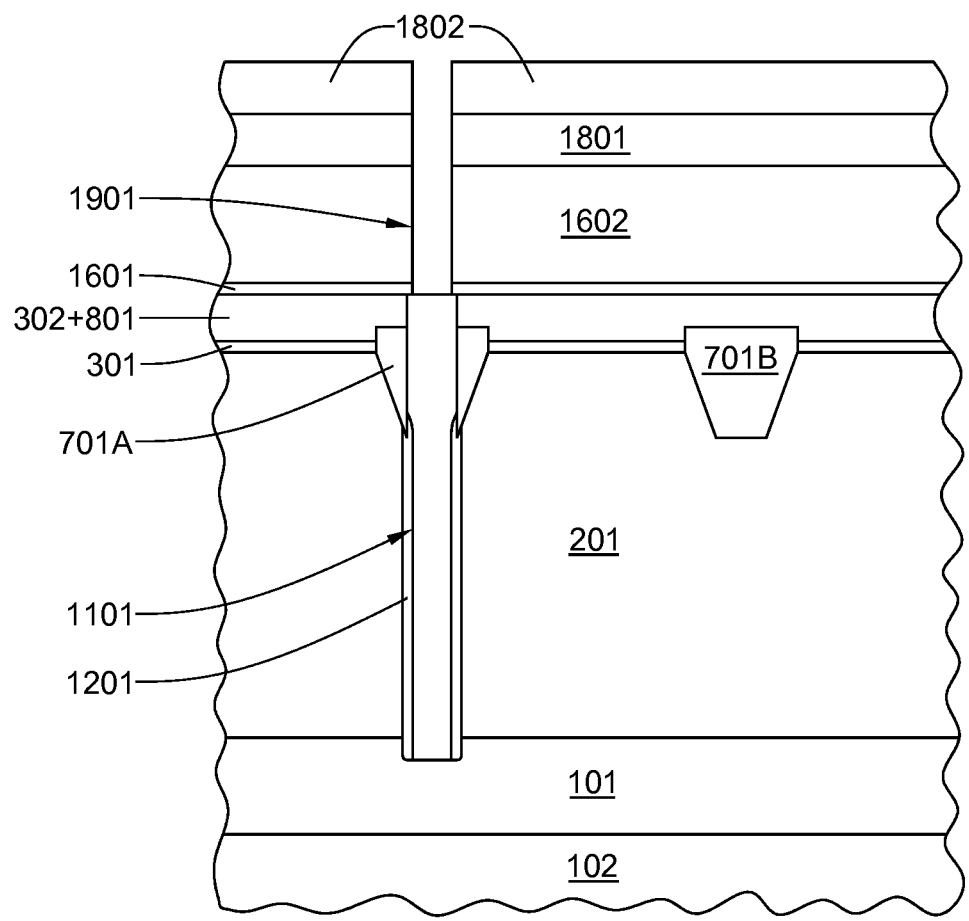

Referring now to FIG. 19, the in-process wafer of FIG. 18 has been further processed by subjecting it to a reactive ion contact etch, which etches through the silicon dioxide layer 1801, the borophosphosilicate glass layer 1602, and the silicon nitride layer 1601, stopping on the doped polysilicon plug 1501, thereby leaving a contact aperture 1901 within layers 1801, 1602 and 1601.

Figure 20:
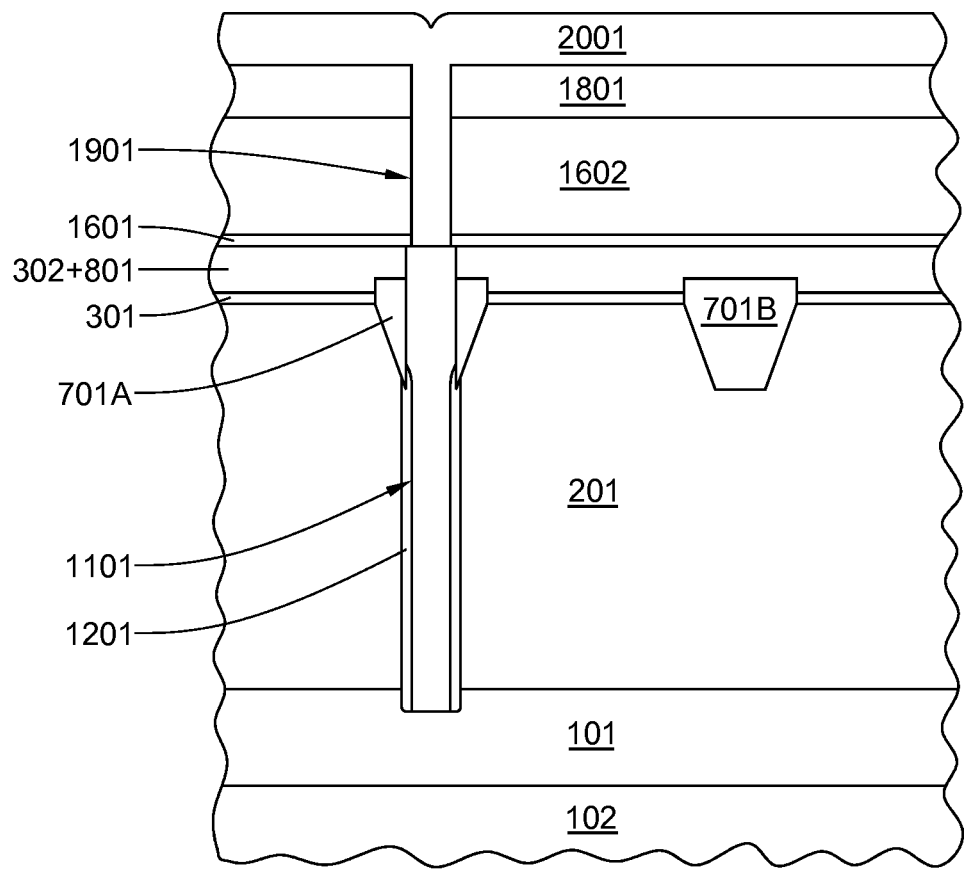

Referring now to FIG. 20, the in-process wafer of FIG. 19 has been further processed by depositing a tungsten metal layer 2001, which coats the upper surface of the wafer and fills the contact aperture 1901 with tungsten metal.

Figure 21:
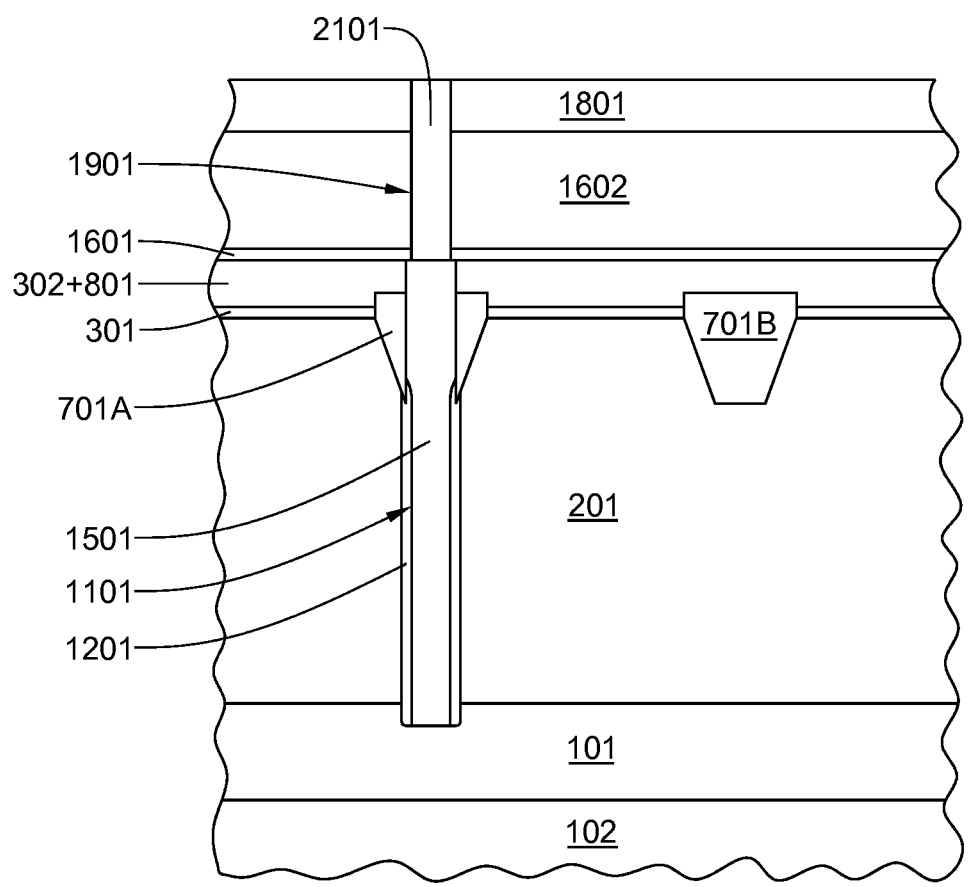

Referring now to FIG. 21, the in-process wafer of FIG. 20 has been further processed by subjecting it to a chemical mechanical planarization step, which leaves tungsten metal only within the contact aperture 1901. This tungsten plug 2101 and the doped polysilicon plug 1501, with which it is in end-to-end contact along with the N-type buried layer 101, is used to electrically isolate circuit structures subsequently constructed on the wafer's upper surface so the circuits can operate at different or independent reference voltages.

Figure 22:
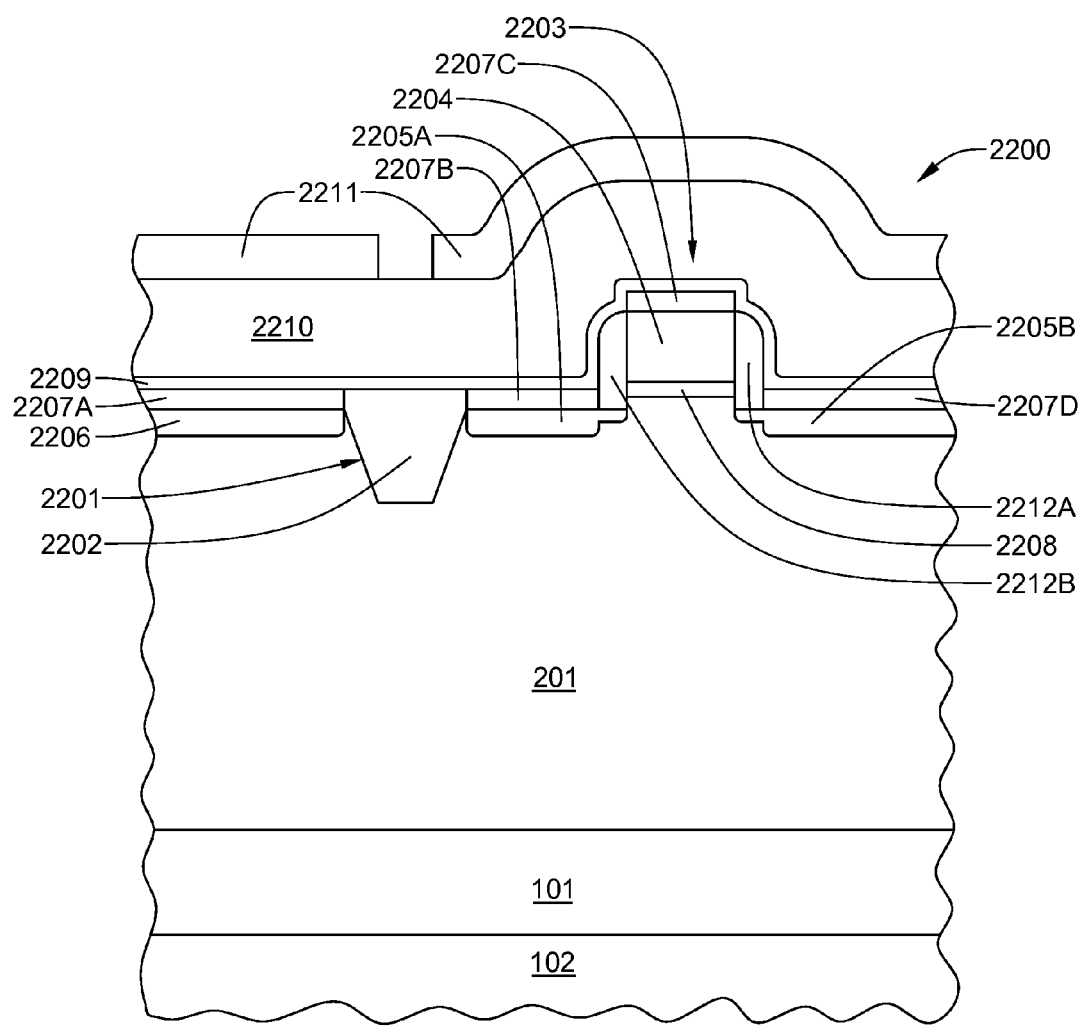

The back-end embodiment of the backside contact structure formation process will now be described with reference to drawing FIGS. 22 through 35. Referring now to FIG. 22, a partially-processed wafer 2200 has already undergone the formation of an N-type base layer 101 that is on top of a P-type silicon substrate 102 and below an epitaxially-grown silicon layer 201, formation of silicon dioxide filled trenches to create silicon dioxide isolation structures, and formation of field-effect transistors. In this thin slice view of a small portion of the in-process semiconductor wafer 2200, a trench 2201 filled with a silicon dioxide isolation structure 2202 is shown adjacent a field effect transistor 2203, which features a silicided gate 2204 and silicided lightly-doped source/drain regions 2205A and 2205B. Another silicided source/drain region 2206 of an undepicted device is also shown to the left of the silicon dioxide isolation structure 2202. Metal silicide regions on top of source/drain region 2206, source/drain region 2205A, gate 2204, and source/drain region 2205B are numbered 2207A, 2207B, 2207C and 2207D, respectively. The upper surface of the wafer and all existing structures thereon, such as the silicon dioxide-filled trench 2201 and field-effect transistor 2203, have been covered, first, with a 500 Å-thick silicon nitride layer 2209, then with a 5000 Å-thick high-density plasma silicon dioxide layer 2210 deposited via chemical vapor deposition. A photoresist mask pattern 2211 has been formed on top of the silicon dioxide layer 2210. Once again, it will be mentioned that contacts to the N-type base layer 101 are made through the isolation structures in order to maximize wafer real estate that is available for device structures. Those skilled in the art of semiconductor fabrication will readily understand that the gate sidewall spacers 2212A and 2212B were utilized to offset the highly-doped source/drain implants from the lightly-doped source/drain implants so that, following high-temperature processing, the lightly-doped source/drain implants will diffuse slightly beneath the edges of the gate 2204 to provide optimum transistor performance characteristics.

Figure 23:
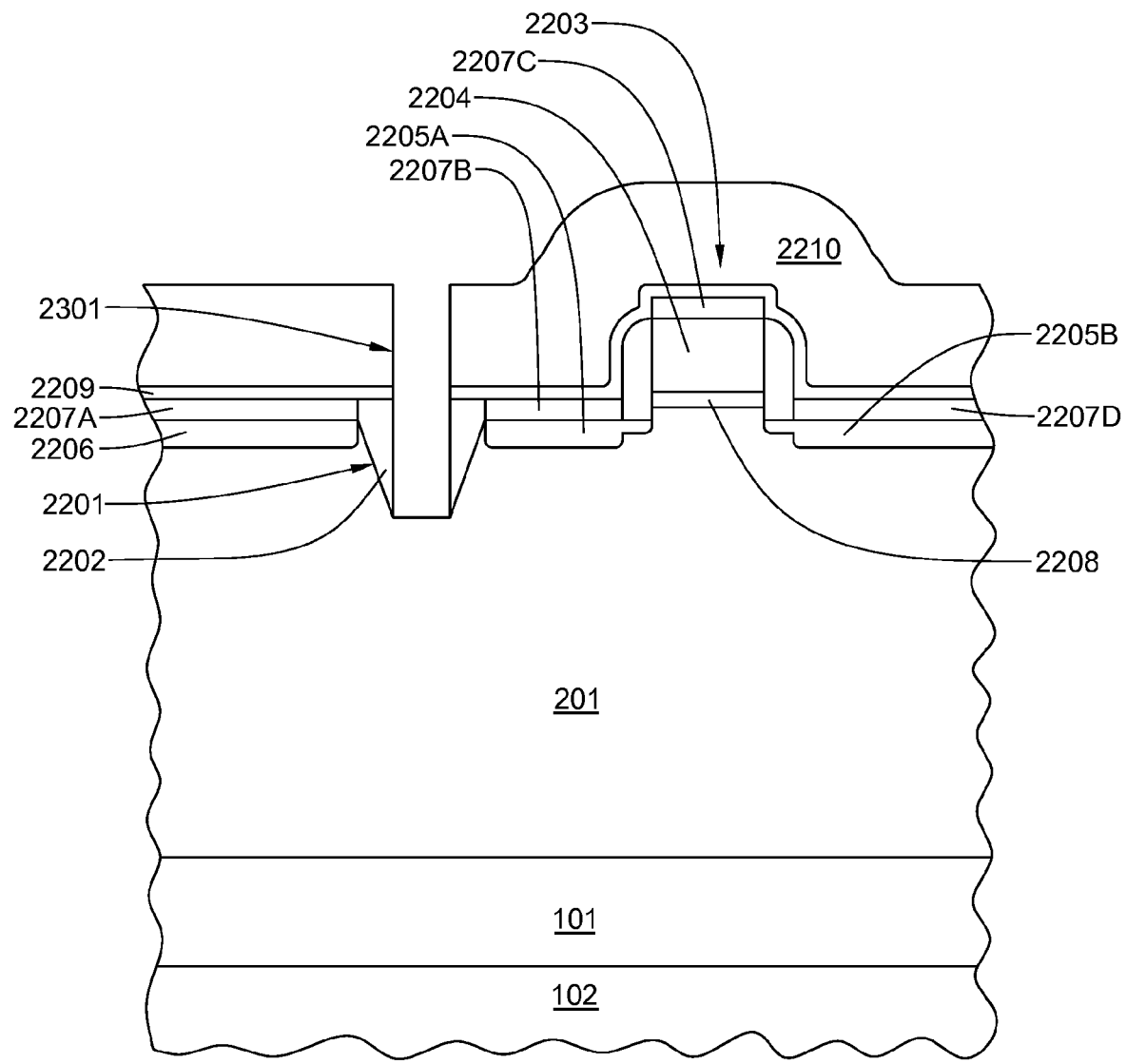

Referring now to FIG. 23, the in-process wafer of FIG. 22 has been further processed by subjecting it to a reactive ion etch, which etches through the high-density plasma silicon dioxide layer 2210, through the silicon nitride layer 2209, through the silicon dioxide isolation structure 2202, stopping on the epitaxially grown layer 201. The reactive ion etch is followed by a photoresist strip step.

Figure 24:
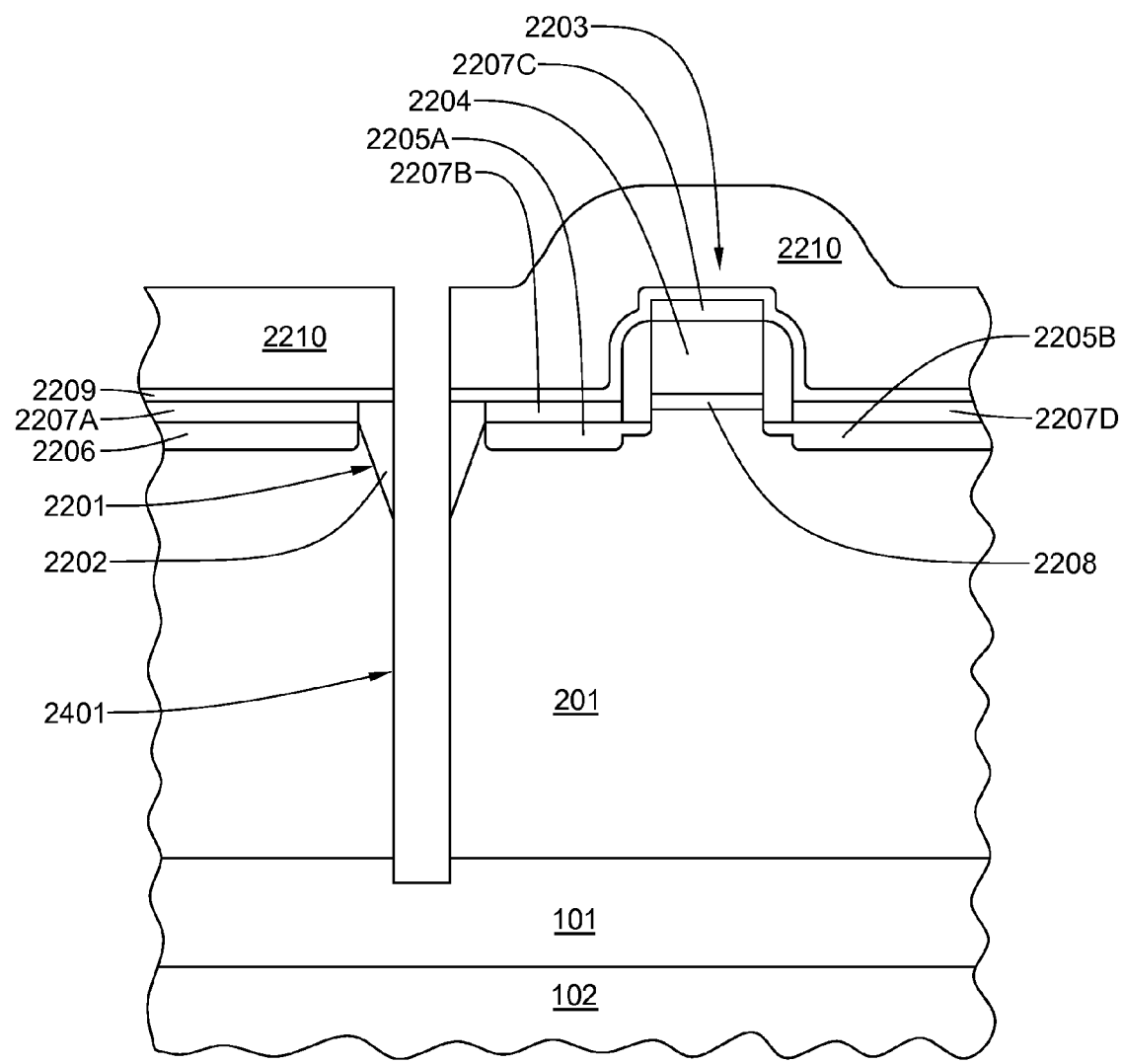

Referring now to FIG. 24, the in-process wafer of FIG. 23 has been further processed by subjecting it to a high-density plasma silicon deep trench isolation (DTI) etch, which etches through the epitaxial silicon layer 201, thereby forming a contact shaft 2401 that terminates in the N-doped buried layer 101.

Figure 25:
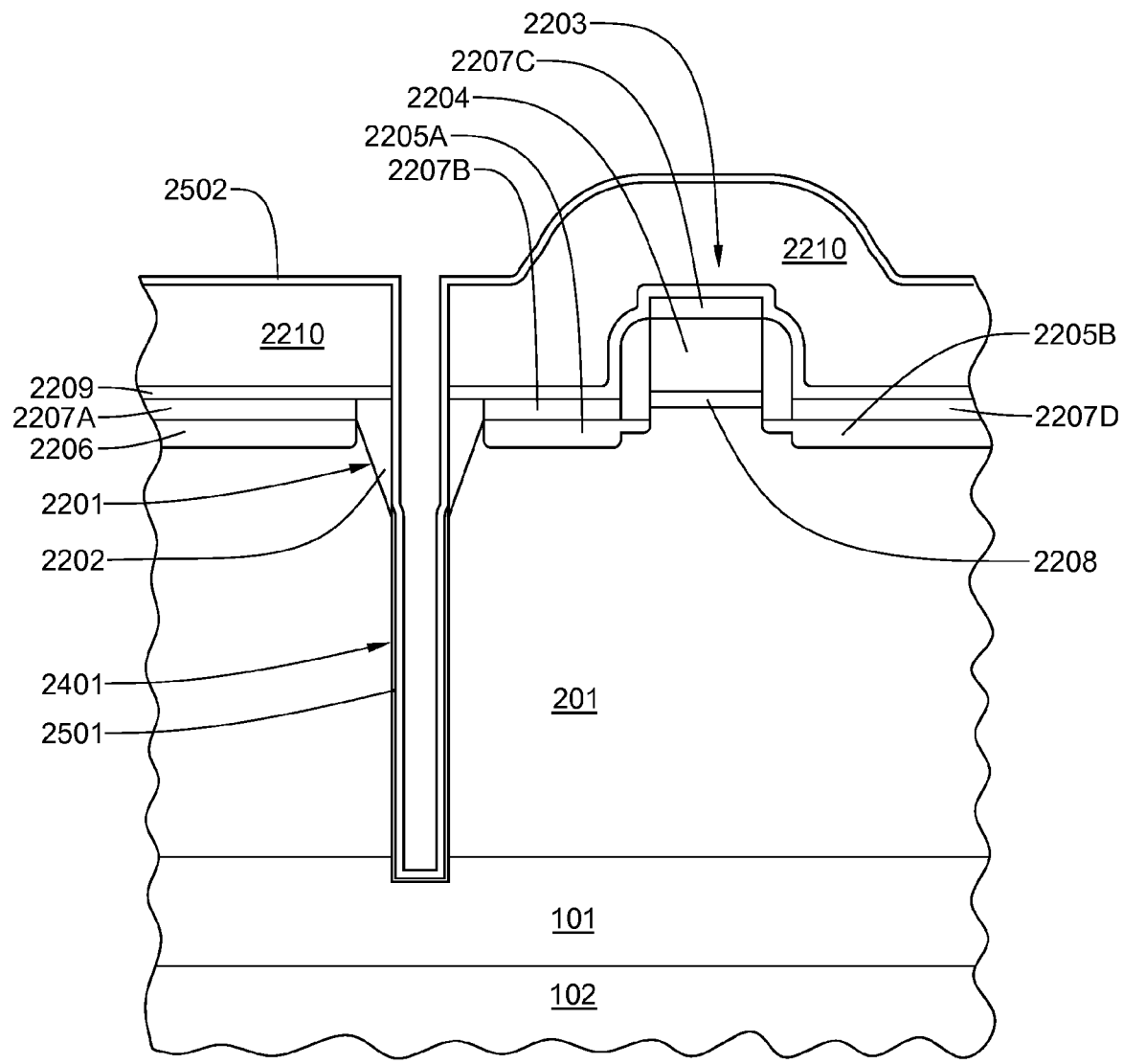

Referring now to FIG. 25, the in-process wafer of FIG. 24 has been further processed by subjecting the wafer to a heat lamp, which forms a thin thermal oxide layer 2501 on the sidewalls of the contact shaft 2401. The thermal oxide layer 2501 not only heals the epitaxial silicon lattice on the sidewalls of the contact shaft 2401, but acts as a glue layer for the subsequent deposition of a TEOS oxide layer 2502, which coats the entire upper surface of the wafer and further coats the walls of the contact shaft 2401. Unlike the front-end process, where thermal oxide was used as the sole dielectric on the walls of the contact trench 1101, thermal oxidation for long periods has serious repercussions in terms of dopant diffusion, or migration, through the epitaxial silicon lattice. For this reason, the back-end process uses a TEOS oxide layer for the primary dielectric for contact shaft walls.

Figure 26:
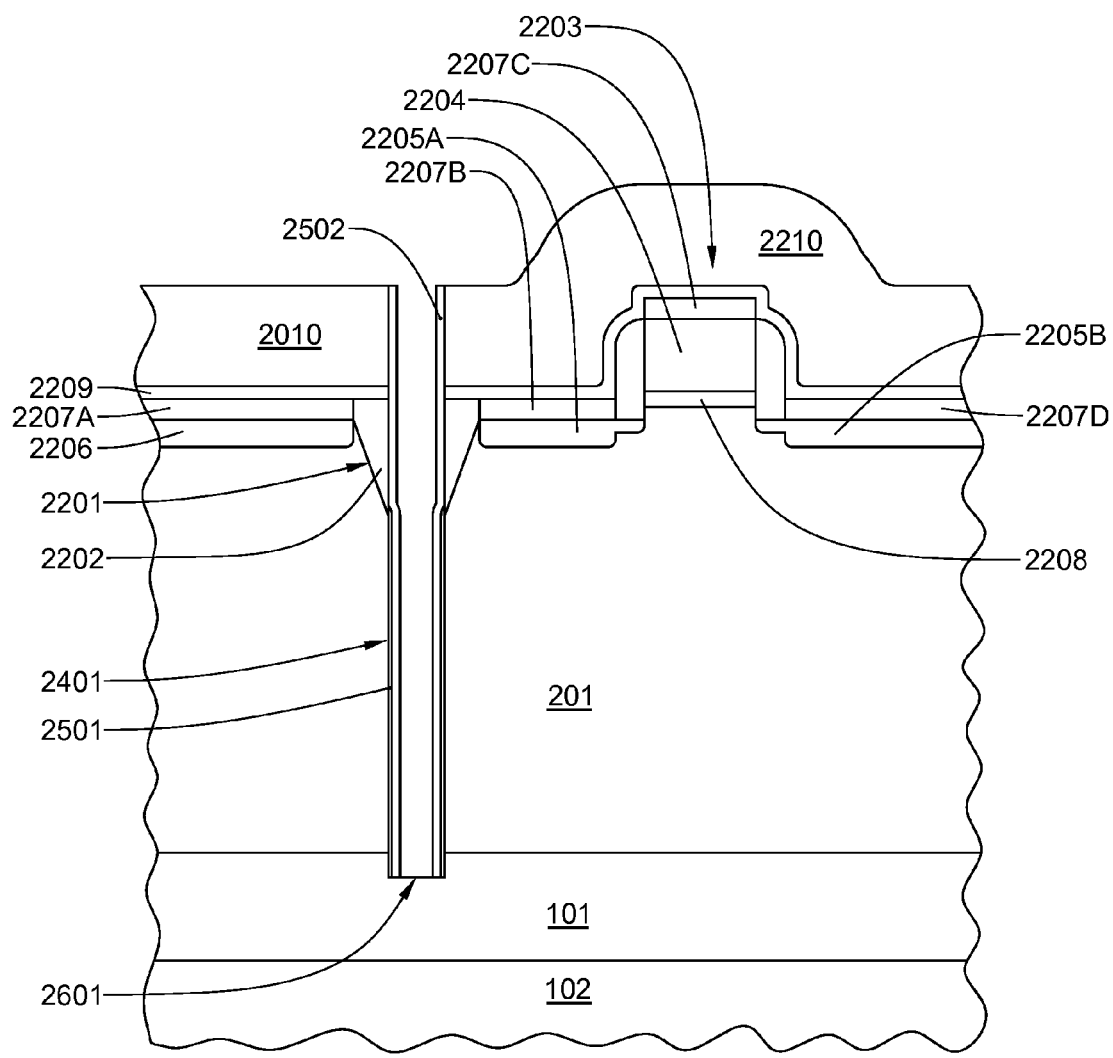

Referring now to FIG. 26, the in-process wafer of FIG. 25 has been further processed by subjecting it to an ion beam etch step, which removes that portion of the thermal oxide layer 2501 and that portion of the TEOS oxide layer 2502 that are at the bottom 2601 of the contact shaft 2401.

Figure 27:
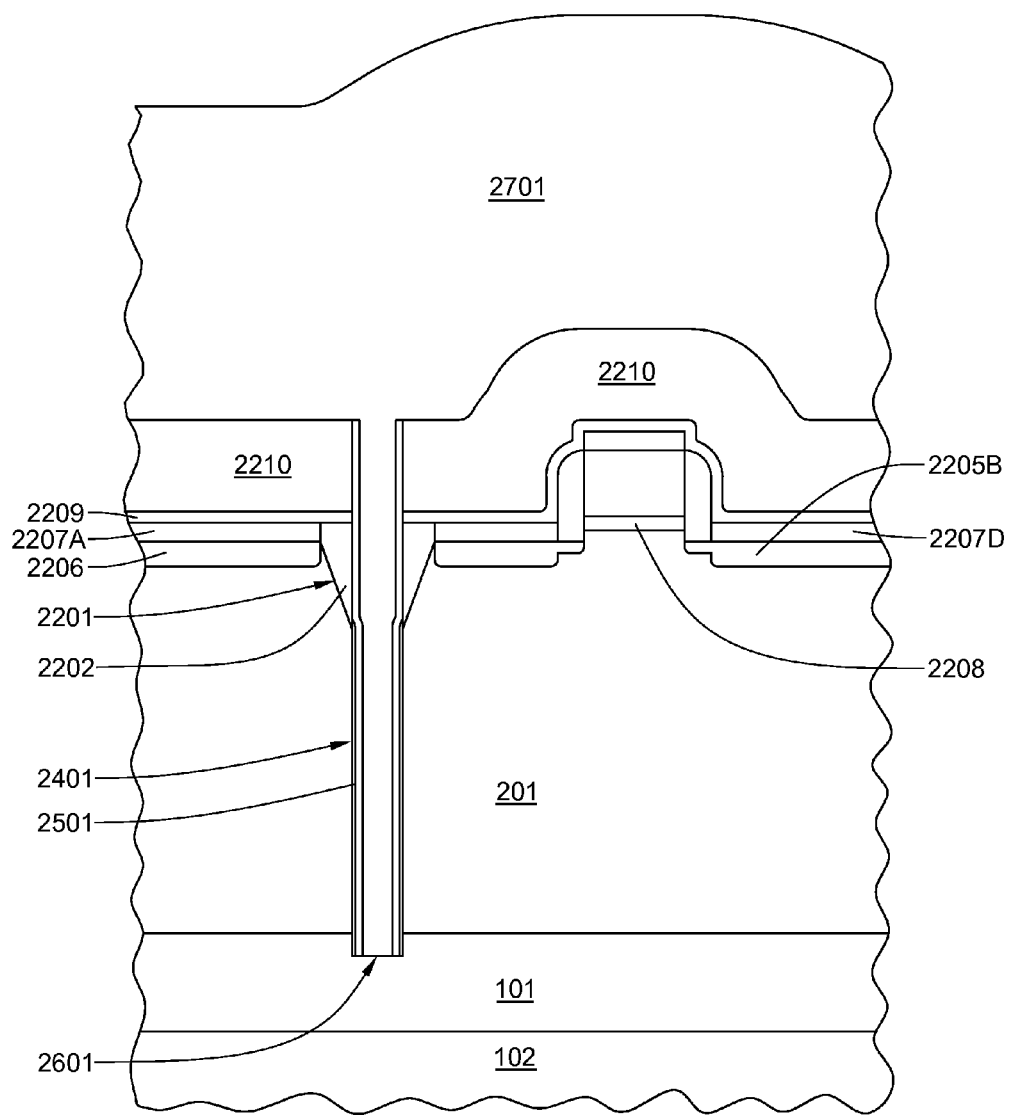

Referring now to FIG. 27, the in-process wafer of FIG. 26 has been further processed by depositing a doped polysilicon layer 2701 over the upper surface of the wafer, thereby filling the contact shaft 2401 down to the bottom 2601 thereof. A layer several microns thick is required to achieve a complete fill of the contact shaft 2401.

Figure 28:
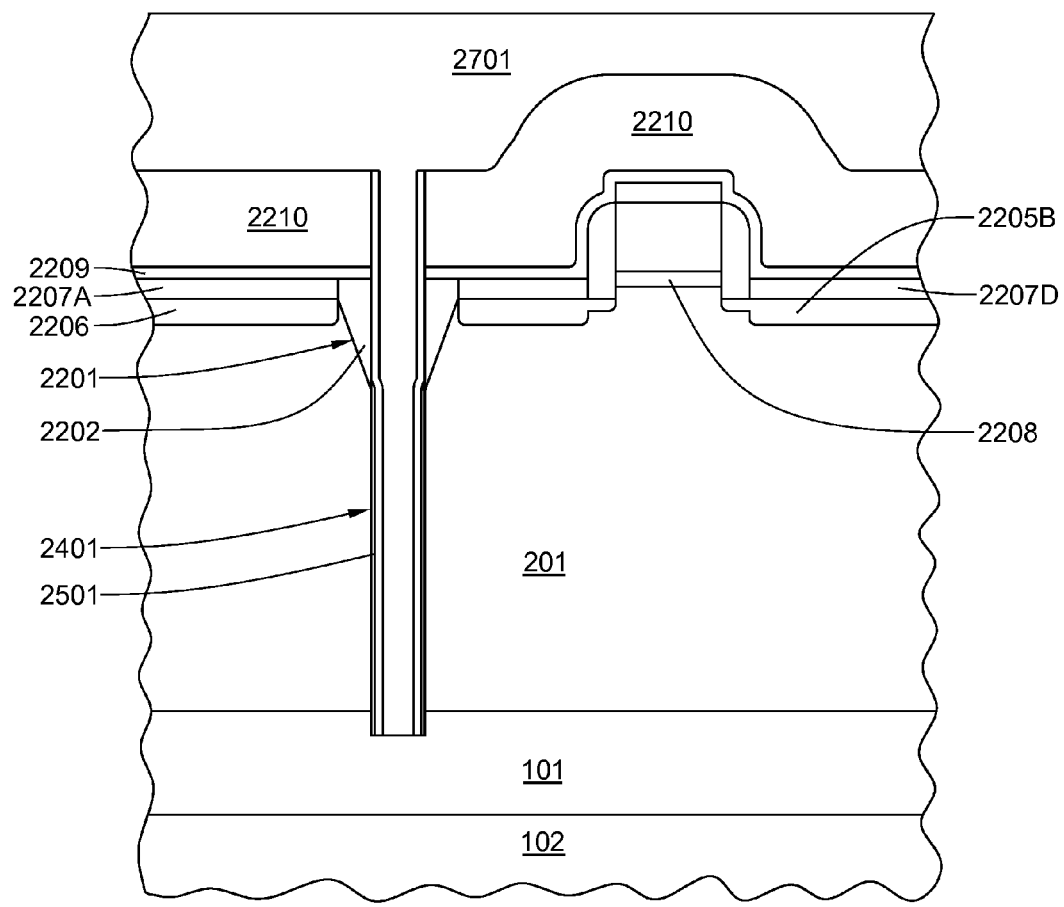
FIG. 28 is a view of the wafer portion of FIG. 27 following a chemical mechanical planarization step, which planarizes the wafer and removes polysilicon on top of the transistor gate structures.

Referring now to FIG. 28, the in-process wafer of FIG. 27 has been further processed by subjecting it to a chemical mechanical planarization step, which reduces the thickness of doped polysilicon layer 2701 and planarizes the wafer.

Figure 29:
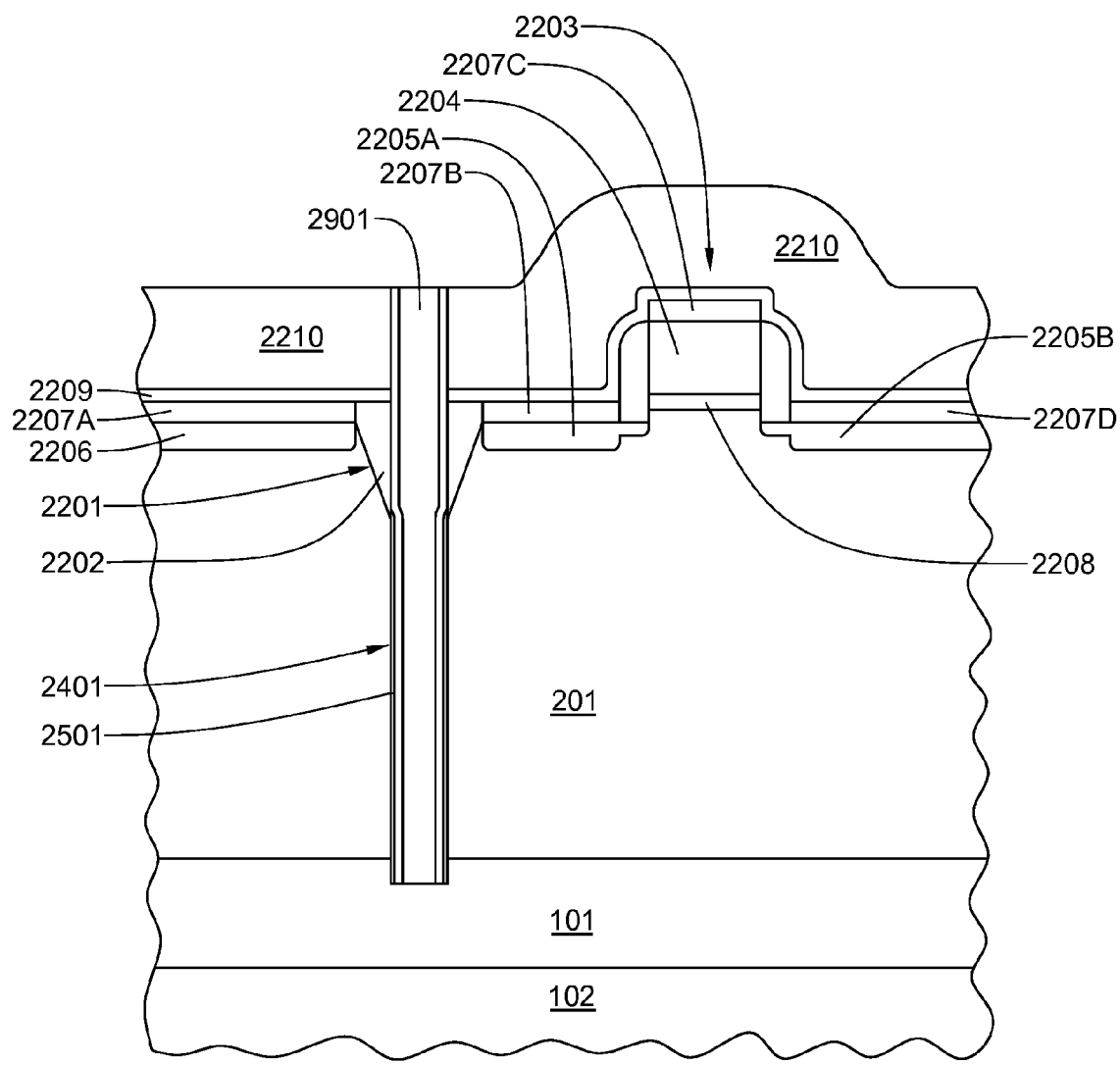
FIG. 29 is a view of the wafer portion of FIG. 28 following a plasma etch back step, which removes all doped polysilicon that is not within the contact shaft.

Referring now to FIG. 29, the in-process wafer of FIG. 28 has been further processed by subjecting it to a plasma etch step, which removes all of the doped polysilicon layer 2701 that is not within the contact shaft 2401. Thus, a doped polysilicon plug 2901 remains within the contact shaft 2401.

Figure 30:
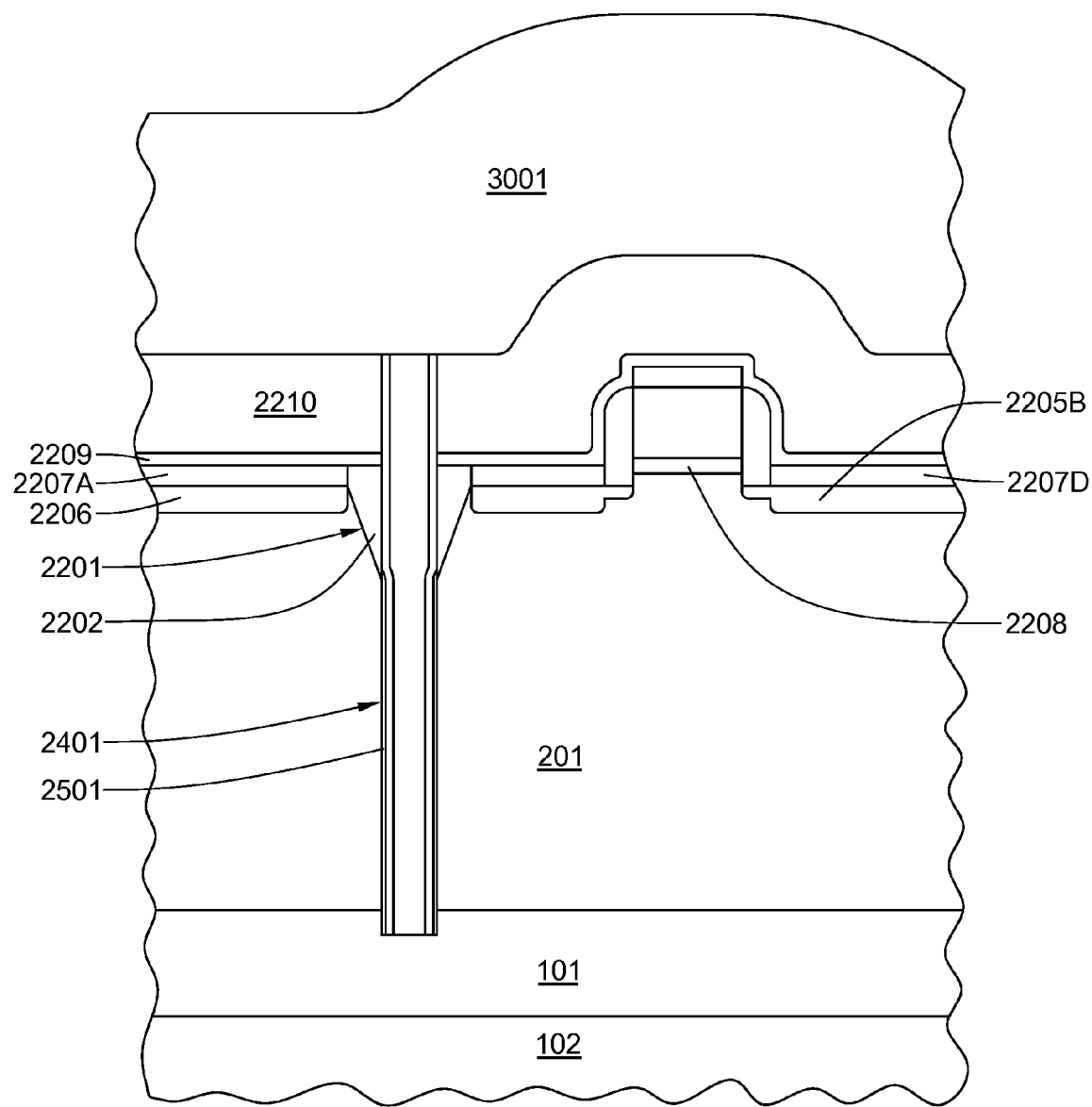
FIG. 30 is a view of the wafer portion of FIG. 29 following deposition of a phosphosilicate glass layer.

Referring now to FIG. 30, the in-process wafer of FIG. 29 has been further processed by depositing, via chemical vapor deposition, a phosphosilicate glass layer 3001 on the upper surface of the wafer.

Figure 31:
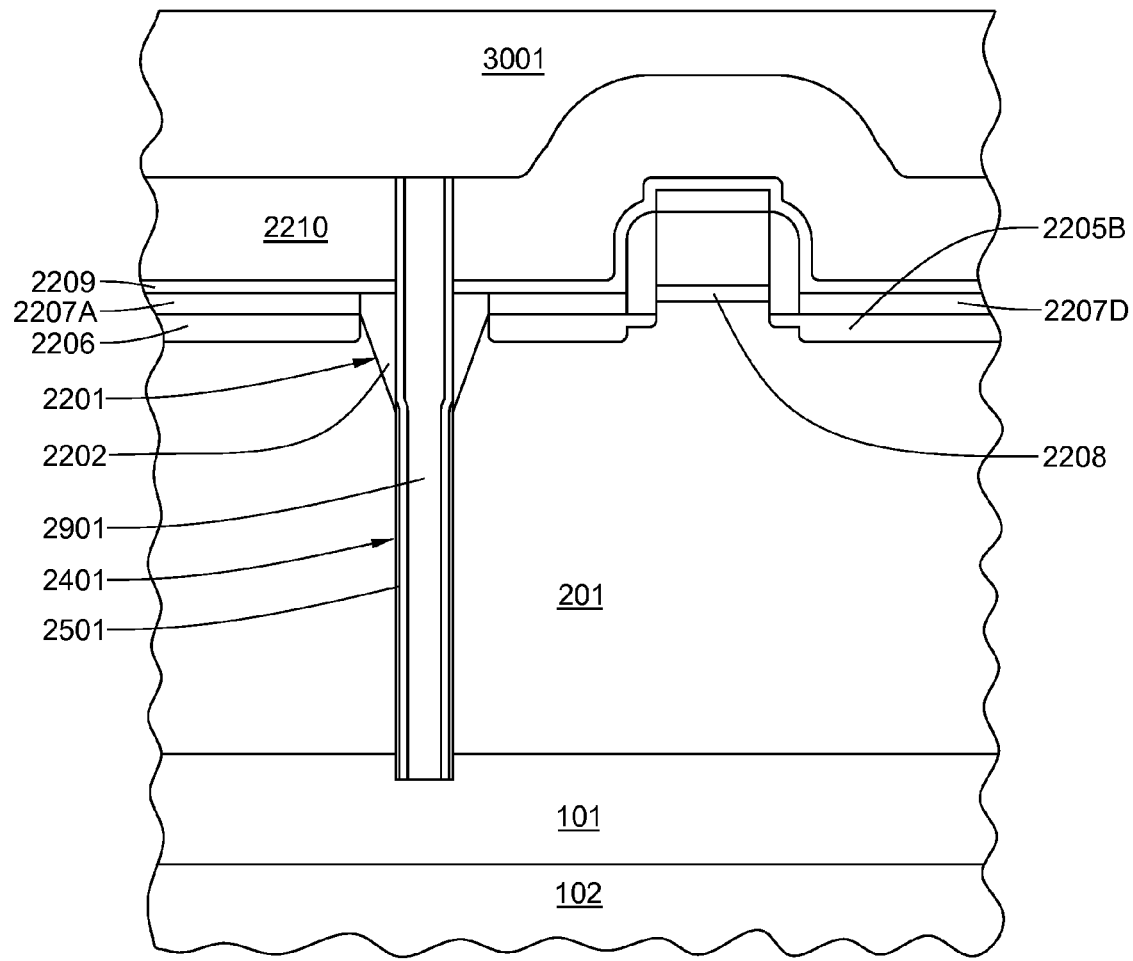
FIG. 31 is a view of the wafer portion of FIG. 30 following a chemical mechanical planarization step, which reduces the thickness of the phosphosilicate glass layer and planarizes the upper surface of the wafer.

Referring now to FIG. 31 the in-process wafer of FIG. 30 has been further processed by subjecting it to a further chemical mechanical planarization step, which reduces the thickness of the phosphosilicate glass layer 3001 and planarizes the upper surface of the wafer.

Figure 32:
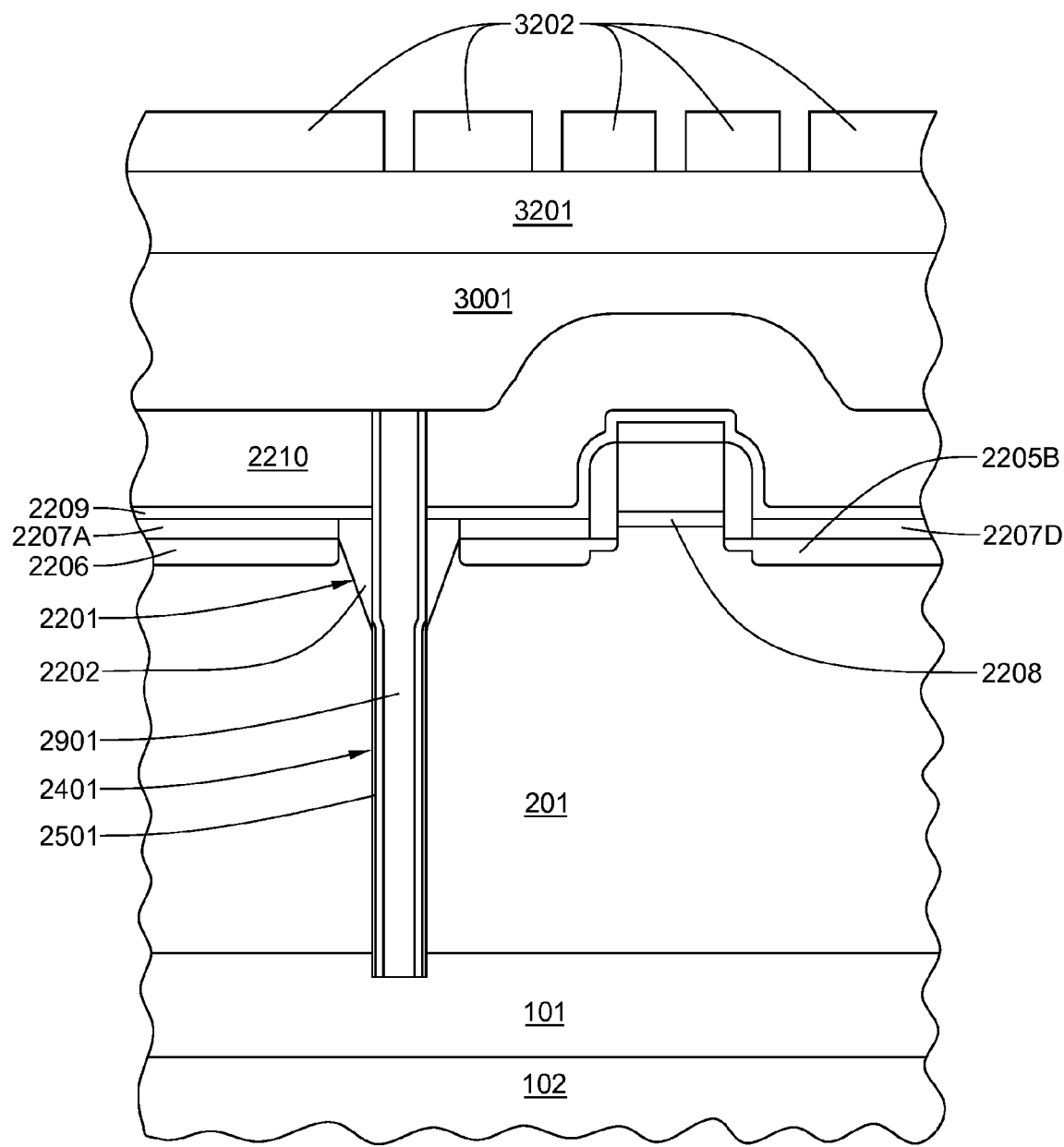
FIG. 32 is a view of the wafer portion of FIG. 31 following the plasma deposition of a silicon dioxide layer and the formation of a photoresist mask thereupon.

Referring now to FIG. 32, the in-process wafer of FIG. 31 has been further processed by depositing, via chemical vapor deposition, a silicon dioxide layer 3201 on the upper surface of the wafer and forming a photoresist mask pattern 3202 thereon.

Figure 33:
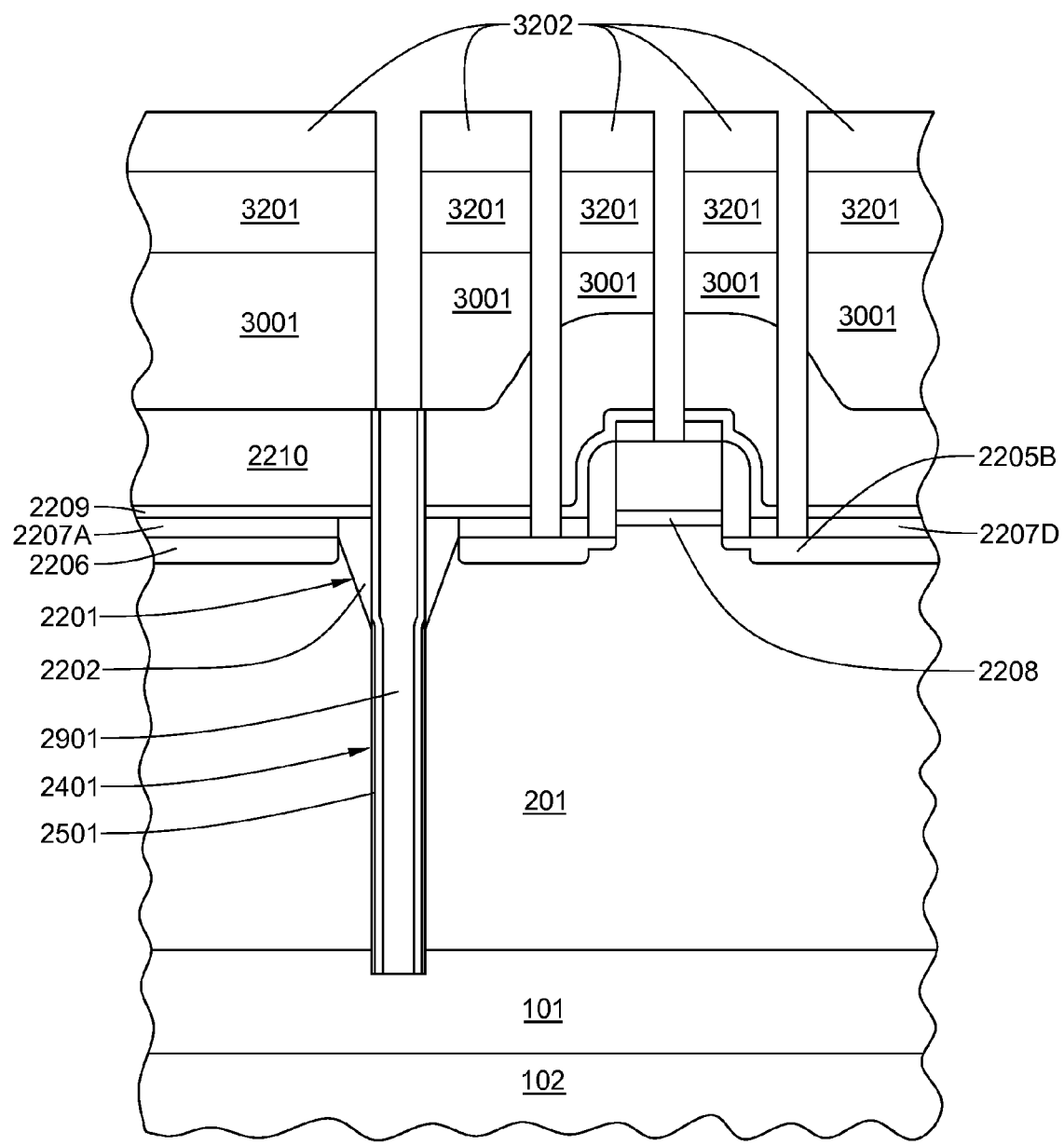
FIG. 33 is a view of the wafer portion of FIG. 32 following a reactive ion contact etch.

Referring now to FIG. 33, the in-process wafer of FIG. 32 has been further processed by subjecting it to a reactive ion contact etch, which stops on silicon, thereby exposing the doped polysilicon plug 2901 within the contact shaft 2401, the gate 2204 and the source/drain regions 2205A and 2205B of the field-effect transistor 2203. Following the reactive ion contact etch, the photoresist mask pattern 3202 is stripped.

Figure 34:
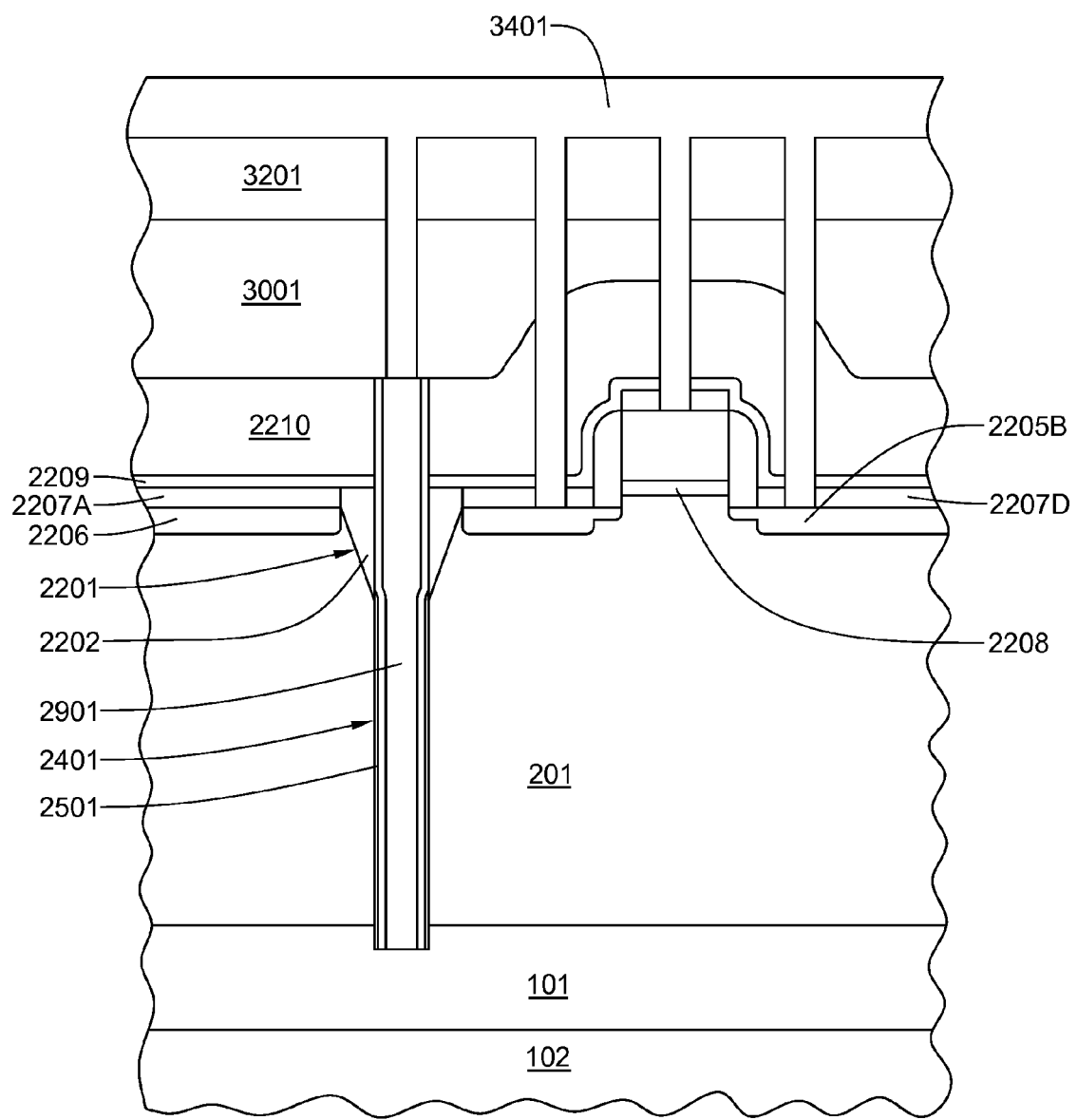
FIG. 34 is a view of the wafer portion of FIG. 33 following the deposition of a tungsten layer that covers the upper surface of the wafer and fills the contact apertures.

Referring now to FIG. 34, the in-process wafer of FIG. 33 has been further processed by depositing a tungsten metal layer 3401 that covers the upper surface of the wafer and fills the contact apertures formed during the reactive ion contact etch of FIG. 33.

Figure 35:
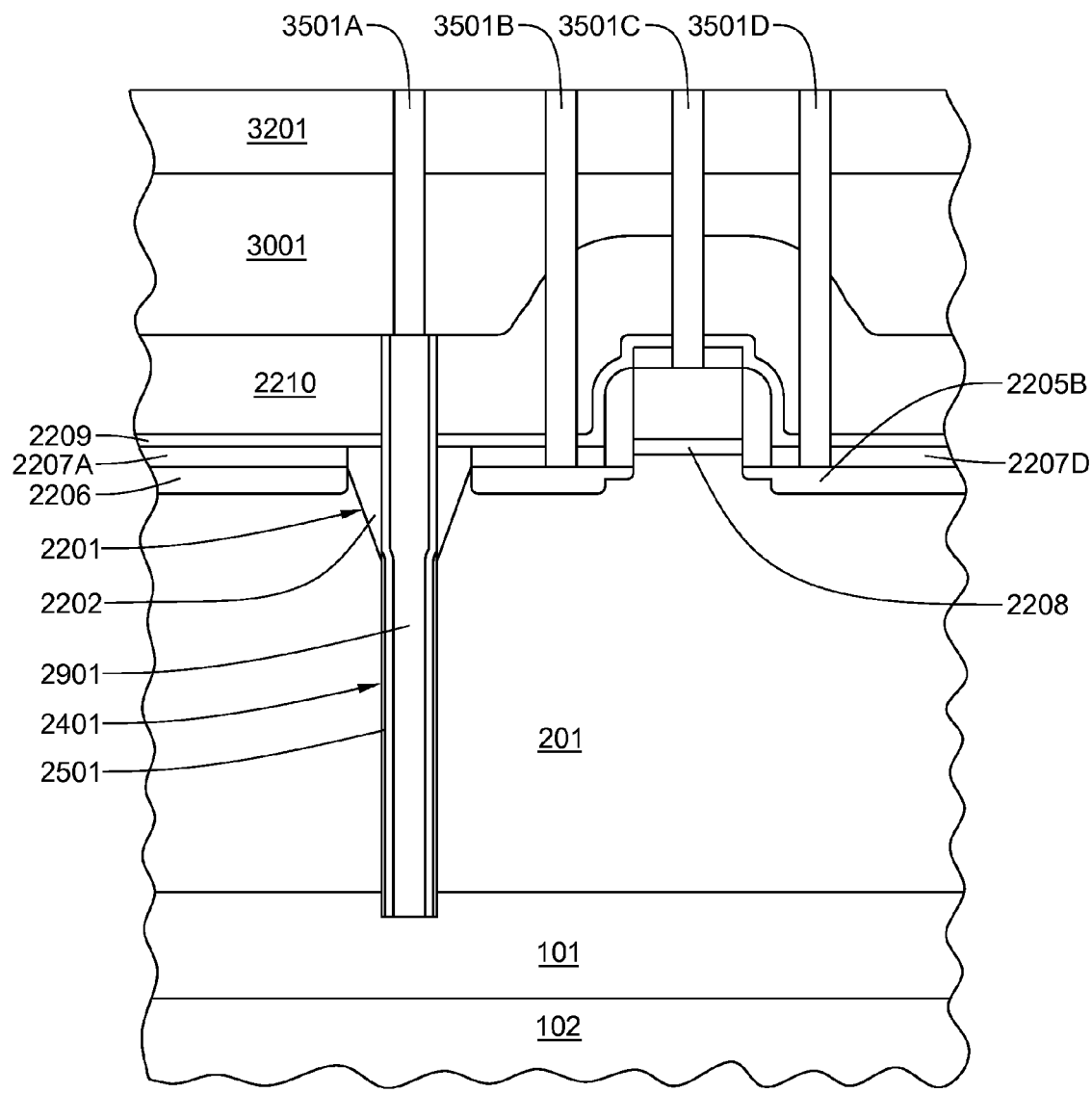
FIG. 35 is a view of the wafer portion of FIG. 34 following a chemical mechanical planarization step, which removes portions of the tungsten layer that is not within the contact apertures.

Referring now to FIG. 35, the in-process wafer of FIG. 34 has been further processed by subjecting it to a chemical mechanical planarization step, which removes portions of the tungsten layer 3401 that is not within the contact apertures. Thus, tungsten metal plugs 3501A, 3501B, 3501C and 3501D remain in the contact apertures that expose the doped polysilicon plug 2901, source/drain region 2205A, FET gate 2204, and source/drain region 2205B, respectively.

Although two embodiments of the method of forming a backside contact structure having selective side-wall isolation have been shown and described, it will be obvious to those having ordinary skill in the art that changes and modifications may be made thereto without departing from the scope and the spirit of the invention as hereinafter claimed.

The invention claimed is:

1. A method of forming a backside contact structure having selective side-wall isolation, said method comprising the steps of:
    subjecting an epitaxial P-type silicon wafer to a high-energy implant with an N-type dopant, followed by an anneal step, which repairs lattice damage to the implanted wafer substrate and activates the N-type implant, thereby creating an N-type layer on the surface of the wafer above a P-type silicon substrate;
    growing a new epitaxial silicon layer on top of the N-type layer;
    forming isolation structures in the new epitaxial silicon layer;
    depositing a silicon nitride hard mask layer on an upper surface of the wafer via chemical vapor deposition and forming a photoresist mask pattern thereon;
    performing a dry, reactive ion nitride etch that creates a silicon nitride hard mask and etches vertical apertures through at least some of the silicon dioxide isolation structures;
    stripping the photoresist mask;
    performing a high-density plasma silicon deep trench isolation etch, which deepens the vertical apertures and forms contact shafts through the new epitaxial silicon layer to the N-type layer below;
    growing a thermal silicon dioxide layer on the walls and at the bottom of the contact shaft;
    clearing thermal silicon dioxide from the N-type layer at the bottom of the contact shaft using an ion beam etch;
    depositing an N-doped polysilicon layer, which fills the contact shafts and coats the upper surface of the wafer;
    subjecting the wafer to a chemical mechanical planarization step, which removes portions of the doped polysilicon layer which are outside the contact shafts, thereby leaving a doped polysilicon plug in each contact shaft;
    depositing a silicon nitride layer and a borophosphosilicate glass (BPSG) layer, in that order, using plasma deposition for each layer;
    subjecting the wafer to chemical mechanical planarization, thereby planarizing the wafer and reducing the thickness of the BPSG layer; and
    forming tungsten plugs that extend through the silicon nitride layer and through the BPSG layer and make contact with the doped polysilicon plugs.

2. The method of claim 1, wherein said isolation structures in the new epitaxial silicon layer are formed using the following sequence of steps:
    creating a thermal oxide layer on an upper surface of the wafer;
    depositing a silicon nitride layer on top of the thermal oxide layer;
    depositing a silicon dioxide layer on top of the silicon nitride layer;
    forming a photo resist mask pattern on top of the glass layer;
    etching through the thermal oxide layer, the silicon nitride layer and the non-doped silicate glass layer, where they are unprotected by the photoresist mask, using an anisotropic plasma etch;
    stripping the photoresist mask pattern;
    subjecting the wafer to a dry etch with an etch chemistry that generates sidewall passivation, thereby resulting in trenches having a tapered geometry;
    depositing a silicon dioxide layer on an upper surface of the wafer using a process selected from the group of deposition processes consisting of high-density plasma deposition and chemical vapor deposition, thereby completely filling the previously etched trenches; and
    subjecting the silicon dioxide layer deposited in the immediately prior step to a chemical mechanical planarization step, which removes silicon dioxide that is not within the trenches, removes the non-doped silicate glass layer, reduces the thickness of the silicon nitride layer, and leaves the filled with non-doped silicate glass isolation structures.

3. The method of claim 1, wherein the step of forming tungsten plugs that extend through the silicon nitride layer and through the BPSG layer and make contact with the doped polysilicon plugs is accomplished with the following sequence of steps:
    depositing a silicon dioxide layer on top of the BPSG layer;
    masking the silicon dioxide layer 1801 with a photoresist contact mask pattern;
    subjecting the wafer to a reactive ion contact etch, which etches through the silicon dioxide layer, the borophosphosilicate glass layer, and the silicon nitride layer, stopping on the doped polysilicon plug, and thereby leaving a contact aperture that passes through the silicon dioxide layer, the BPSG layer and silicon nitride layer;
    depositing a tungsten metal layer, which coats the upper surface of the wafer and fills the contact apertures with tungsten metal; and
    subjecting the wafer to a chemical mechanical planarization step, which leaves tungsten metal only within the contact apertures.

4. The method of claim 2, wherein said silicon dioxide layer is non-doped silicate glass.

5. The method of claim 2, wherein said silicon dioxide layer is high-density plasma silicon dioxide.

6. The method of claim 1, wherein said backside contact structure is formed at a frontend stage of wafer processing following the formation of shallow trench isolation, but prior to formation of device transistors.

7. The method of claim 6, wherein field effect transistors are formed with silicided gates and silicided lightly-doped source/drain regions.

8. The method of claim 5, wherein said high-density plasma silicon dioxide layer is about 5000 Å-thick, and is deposited via chemical vapor deposition.

9. The method of claim 1, wherein contact shafts are etched through silicon dioxide isolation structures in order to maximize wafer real estate that is available for device structures.

10. A method of forming a backside contact structure having selective side-wall isolation, said method comprising the steps of:
  subjecting an epitaxial P-type silicon wafer to a high-energy implant with an N-type dopant, followed by an anneal step, which repairs lattice damage to the implanted wafer substrate and activates the N-type implant, thereby creating an N-type layer on the surface of the wafer above a P-type silicon substrate;
  growing a new epitaxial silicon layer on top of the N-type layer;
  forming isolation structures in the new epitaxial silicon layer;
  depositing a silicon nitride hard mask layer on an upper surface of the wafer via chemical vapor deposition and forming a photoresist mask pattern thereon;
  performing a dry, reactive ion nitride etch that creates a silicon nitride hard mask and etches vertical apertures through at least some of the silicon dioxide isolation structures;
  stripping the photoresist mask;
  performing a high-density plasma silicon deep trench isolation etch, which deepens the vertical apertures and forms contact shafts through the new epitaxial silicon layer to the N-type layer below; and
  forming doped polysilicon contact plugs within the contact shafts.

11. The method of claim 10, which further comprises the steps of:
  depositing a silicon nitride layer and a borophosphosilicate glass layer following formation of the doped polysilicon contact plugs;
  subjecting the wafer to chemical mechanical planarization, thereby planarizing the wafer and reducing the thickness of the BPSG layer; and
  forming tungsten plugs that extend through the silicon nitride layer and through the BPSG layer and make contact with the doped polysilicon plugs.

12. The method of claim 10, wherein said isolation structures in the new epitaxial silicon layer are formed using the following sequence of steps:
  creating a thermal oxide layer on an upper surface of the wafer;
  depositing a silicon nitride layer on top of the thermal oxide layer;
  depositing a silicon dioxide layer on top of the silicon nitride layer;
  forming a photo resist mask pattern on top of the glass layer;
  etching through the thermal oxide layer, the silicon nitride layer and the non-doped silicate glass layer, where they are unprotected by the photoresist mask, using an anisotropic plasma etch;
  stripping the photoresist mask pattern;
  subjecting the wafer to a dry etch with an etch chemistry that generates sidewall passivation, thereby resulting in trenches having a tapered geometry;
  depositing a silicon dioxide layer on an upper surface of the wafer using a process selected from the group of deposition processes consisting of high-density plasma deposition and chemical vapor deposition, thereby completely filling the previously etched trenches; and
  subjecting the silicon dioxide layer deposited in the immediately prior step to a chemical mechanical planarization step, which removes silicon dioxide that is not within the trenches, removes the non-doped silicate glass layer, reduces the thickness of the silicon nitride layer, and leaves the filled with non-doped silicate glass isolation structures.

13. The method of claim 10, wherein the step of forming tungsten plugs that extend through the silicon nitride layer and through the BPSG layer and make contact with the doped polysilicon plugs is accomplished with the following sequence of steps:
  depositing a silicon dioxide layer on top of the BPSG layer;
  masking the silicon dioxide layer 1801 with a photoresist contact mask pattern;
  subjecting the wafer to a reactive ion contact etch, which etches through the silicon dioxide layer, the borophosphosilicate glass layer, and the silicon nitride layer, stopping on the doped polysilicon plug, and thereby leaving a contact aperture that passes through the silicon dioxide layer, the BPSG layer and silicon nitride layer;
  depositing a tungsten metal layer, which coats the upper surface of the wafer and fills the contact apertures with tungsten metal; and
  subjecting the wafer to a chemical mechanical planarization step, which leaves tungsten metal only within the contact apertures.

14. The method of claim 12, wherein said silicon dioxide layer is non-doped silicate glass.

15. The method of claim 10, wherein said backside contact structure is formed at a frontend stage of wafer processing following the formation of shallow trench isolation, but prior to formation of device transistors.

16. The method of claim 15, wherein field effect transistors are formed with silicided gates and silicided lightly-doped source/drain regions.

17. The method of claim 16, wherein said high-density plasma silicon dioxide layer is about 5000 Å-thick, and is deposited via chemical vapor deposition.

18. The method of claim 10, wherein contact shafts are etched through silicon dioxide isolation structures in order to maximize wafer real estate that is available for device structures.

* * * * *